US006345228B1

(12) United States Patent
Lees

(10) Patent No.: US 6,345,228 B1
(45) Date of Patent: Feb. 5, 2002

(54) ROAD VEHICLE SENSING APPARATUS AND SIGNAL PROCESSING APPARATUS THEREFOR

(75) Inventor: Richard Andrew Lees, Buckinghamshire (GB)

(73) Assignee: Diamond Consulting Services Limited, Buckinghamshire (GB)

(*) Notice: Subject to any disclaimer, the term of this patent is extended or adjusted under 35 U.S.C. 154(b) by 0 days.

(21) Appl. No.: 09/117,726

(22) PCT Filed: Feb. 5, 1997

(86) PCT No.: PCT/GB97/00323

§ 371 Date: Aug. 5, 1998

§ 102(e) Date: Aug. 5, 1998

(87) PCT Pub. No.: WO97/29468

PCT Pub. Date: Aug. 14, 1997

(30) Foreign Application Priority Data

Feb. 6, 1996 (GB) ............................................ 9602378

(51) Int. Cl.[7] ............................................... G01R 33/04

(52) U.S. Cl. ....................... 701/117; 340/939; 340/941; 324/254; 324/255; 324/236; 324/653; 324/655; 331/65

(58) Field of Search .......................... 701/117; 324/253, 324/41, 178, 179; 340/907, 939, 941, 933, 938

(56) References Cited

U.S. PATENT DOCUMENTS 3,863,206 A * 1/1975 Rabie ........................ 340/38 L
3,943,339 A * 3/1976 Koerner et al. .......... 235/92 TC
3,983,531 A * 9/1976 Corrigan .................... 340/31 R
3,984,764 A * 10/1976 Koerner ........................ 324/41
4,568,937 A * 2/1986 Clark .......................... 340/939
4,680,717 A * 7/1987 Martin ....................... 364/436
4,714,925 A * 12/1987 Bartlett .................. 340/825.55
4,943,805 A * 7/1990 Dennison .................... 340/933
5,089,815 A * 2/1992 Potter et al. ................ 340/905
5,408,179 A * 4/1995 Sampey et al. ............. 324/253
5,491,475 A * 2/1996 Rouse et al. ................ 340/933
5,512,891 A * 4/1996 Kang ........................... 340/941
5,617,086 A * 4/1997 Klashinsky et al. ........ 340/907
5,648,904 A * 7/1997 Scott .......................... 364/436
5,751,225 A * 5/1998 Fedde et al. ................ 340/941

FOREIGN PATENT DOCUMENTS

FR 2 463 412 2/1981
GB 2 056 688 5/1983

OTHER PUBLICATIONS

"Von Verkehrsdurchsage bis Mautstation", by Von Dr. Eckhart Gleissner, vol. 63, No. 7, Mar. 1991, pp. 73–75, 78 (translation also attached).

* cited by examiner

*Primary Examiner*—William A. Cuchlinski, Jr.
*Assistant Examiner*—Tuan C To
(74) *Attorney, Agent, or Firm*—Westman, Champlin & Kelly, P.A.

(57) ABSTRACT

A road vehicle sensor provides an output signal having a magnitude which varies with time through a plurality of values as a vehicle passes the sensor. Signal processing apparatus monitors the timing of sensor signals generated from sensors in adjacent lanes of a highway and provides an indication when such sensor signals could correspond to a double count with a single vehicle being detected by both sensors. Then, the geometric mean of the amplitudes of the sensor signals from the sensors in adjacent lanes is calculated and is used to indicate a double count if the geometric mean is below a threshold value. Signal processing arrangements are also described to detect tailgating vehicles which may be simultaneously detected by a sensor, and for determining the length of slow moving or stationary traffic.

58 Claims, 9 Drawing Sheets

Peak amplitudes
Amplitude
70
71
Equal amplitude = 28% of peak
eq
Time

Amplitude
Time

Amplitude
Time

ROAD VEHICLE SENSING APPARATUS AND SIGNAL PROCESSING APPARATUS THEREFOR

BACKGROUND OF THE INVENTION

The present invention relates to road vehicle sensing apparatus.

In the prior art a known road vehicle sensing apparatus comprises at least one sensor for location in at least one lane of a highway to detect vehicles travelling in said lane. A signal generation circuit is connected to the sensor and is arranged to produce a sensor signal having a magnitude which varies with time through a plurality of values as a vehicle passes the sensor in said lane. When there is no vehicle near the sensor, the signal magnitude is at a base value. Apparatus of this type will be referred to herein as road vehicle sensing apparatus of the type defined.

The sensors used in road vehicle sensing apparatus of the type defined are typically inductive loops located under the road surface, which are energized to provide an inductive response to metal components of a vehicle above or near the loop. The response is usually greatest, providing a maximum sensor signal magnitude, when the maximum amount of metal is directly over the loop. Other types of sensor may also be employed which effectively sense the proximity of a vehicle and can provide a graduated sensor signal increasing to a maximum as the vehicle approaches and then declining again as the vehicle goes past the sensor. For example magnetometers may be used for this purpose.

In a multi lane highway, with two or more traffic lanes for a single direction of travel, it is normal to provide separate sensors for each lane so that two vehicles travelling in lanes side by side can be separately counted. The signal generation circuit is arranged to provide a separate said signal for each sensor. The sensors in adjacent lanes are usually aligned across the width of the highway. Apparatus of this type with adjacent sensors in the lanes of a multi lane highway will be referred to herein as road vehicle sensing apparatus of the type defined for a multi lane highway.

It is also normal practice for the sensor installation on a single lane of highway to include two sensors installed a distance apart along the lane of the highway. Again the signal generation circuit produces a separate said signal for each sensor. This is arrangement allows the direction of travel of a vehicle in the lane to be determined and also the timing of the signals from the two sensors can be used to provide a measure of vehicle speed. The first sensor in the normal direction of travel in the lane can be called the entry sensor and the second sensor can be called the leaving sensor. Apparatus of this type will be referred to herein as vehicle sensing apparatus of the type defined with two successive sensors in a single lane.

In the prior art, vehicle sensing apparatus of the type defined has been used primarily for the purpose of counting the vehicles to provide an indication of traffic density. Although the signal generation circuit of the apparatus of the type defined provides a sensor signal of varying or graduated magnitude, a typical prior art installation has a detection threshold set at a magnitude level above the base value to provide an indication of whether or not a vehicle is being detected by the sensor. Thus, in prior art installations, the only information available from the sensing apparatus is a binary signal indicating whether or not the sensor is currently detecting the vehicle, that is whether the sensor is "detect".

Prior art sensing apparatus using one or more inductive loops under the road surface have signal generation circuitry arranged to energize the loops at a frequency typically in the range 60 to 90 kHz. In some examples, a phase locked loop circuit is arranged to keep the energizing frequency constant as the resonance of the loop and associated capacitance provided by the circuit is perturbed by the presence of the metal components of a road vehicle passing over the loop. The sensor signal produced by such signal generation circuit is typically the correction signal generated by the phase locked loop circuit required to maintain the oscillator frequency at the desired value. In a typical circuit, the correction signal may be a digital number contained in a correction counter. As a vehicle passes the loop sensor, the digital number from the counter may progressively rise from zero count up to a maximum count (which in some examples may be between 200 and 1,000) and then falls again to zero as the vehicle moves away from the sensor loop. As mentioned above, prior art installations are arranged to set a threshold value for the sensor output signal, above which the sensor is deemed to be "in detect".

SUMMARY OF THE INVENTION

The present invention in its various aspects is based on the realization that there is far more information available in the output signals of vehicle sensing apparatus of the type defined which can be employed so as to improve the reliability of the prior art installations.

Prior art installations are reasonably reliable and accurate in counting vehicles, so long as the traffic is free flowing along the highway with a reasonable spacing between vehicles, and so long as the vehicles do not cross from one lane to another in the vicinity of the sensor installation. In practice, however, a typical installation has a vehicle count accuracy of only about plus or minus one percent even in free flowing traffic conditions. In congested traffic conditions, count accuracy falls dramatically and is seldom specified.

There is an increasing need for more accurate automatic traffic monitoring. This need has been stimulated by proposals for highways to be maintained, or even constructed, with private finance, and compensation to be paid to the constructors/maintainers by Central Government or a Regional Authority in accordance with the number of vehicles using the highway. Even a 1% error in count accuracy would be too high. Importantly, also, the vehicle sensing apparatus should be capable of determining the class of the vehicles using the highway, usually on the basis of vehicle length. Also, the sensor should be able to provide accurate information even in congested conditions.

Various aspects and preferred embodiments of the present invention are defined in the appended claims.

BRIEF DESCRIPTION OF THE DRAWINGS

Aspects and examples of the invention will now be described with reference to the accompanying drawings in which.

DESCRIPTION OF THE PREFERRED EMBODIMENTS

Figure 1:
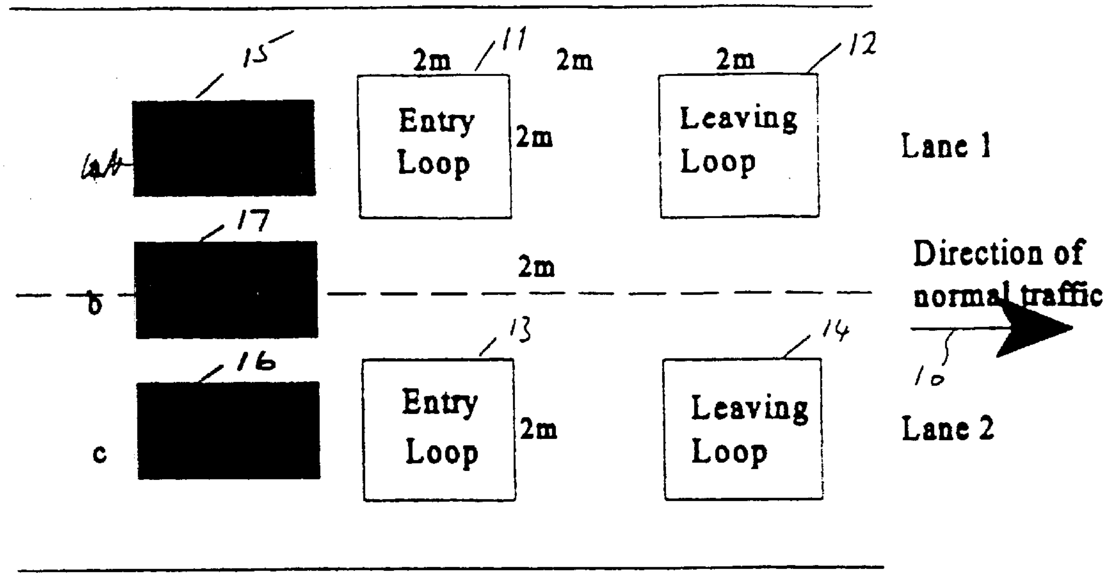
FIG. 1 is a plan view of a typical vehicle sensor installation for one carriageway of a two lane highway.

FIG. 1 illustrates a typical sensor loop illustration on a two lane carriageway of a highway. The normal direction of traffic on the carriageway is from left to right as shown by the arrow 10. Entry loop 11 and leaving loop 12 are located one after the other in the direction of travel under the surface on lane 1 of the highway and entry loop 13 and leaving loop 14 are located under lane 2. In the illustrated installation, the entry loops 11 and 13 of the two lanes of the highway are aligned across the width of the highway and the leaving loops 12 and 14 are also aligned. In the illustrated example, each of the loops has a length in the direction of travel of 2 meters and the adjacent edges of the entry and leaving loops are spaced apart also by 2 meters, so that the centers of the entry and leaving loops are spaced apart by 4 meters. Again in the illustrated example, all the loops have a width of 2 meters and the adjacent entry loops 11 and 13 have neighbouring edges about 2 meters apart, with a similar spacing for the adjacent edges of the leaving loops 12 and 14.

This is an example of a typical installation in which an entry and a leaving loop is provided in each lane of a carriageway. It is also known to provide additional combinations of entry and leaving loop so that, for example, for a two lane highway there may be three entry and leaving loop combinations with an additional loop combination located along the center line of the highway between the two lanes. Similarly, for three lane highways, it is known to provide five entry and leaving loop combinations spread across the carriageway. Many aspects of the present invention are equally applicable to these alternative arrangements.

Figure 2:
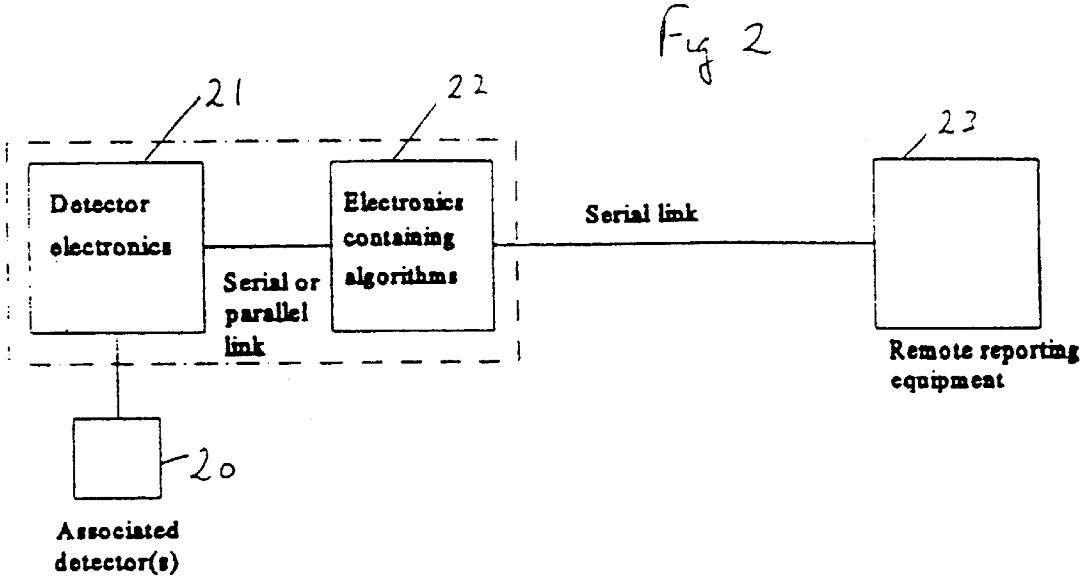
FIG. 2 is a block schematic diagram of a vehicle sensing apparatus which can embody the present invention.

Referring now to FIG. 2, a typical electronic installation for vehicle sensing apparatus of the type defined is shown. The various sensor loops, as illustrated in FIG. 1, are represented generally by the block 20. Each of the entry and leaving loops are connected to detector electronics 21 which provides the signal generation circuit for the various loops. The detector electronics may be arranged to energize each of the loops at a particularly detector station (e.g. as illustrated in FIG. 1) simultaneously so that four sensor signals are then produced by the detector electronics 21 continuously representing the status of each of the loops. However, more commonly, the detector electronics 21 is arranged to energize or scan each of the loops of the detector station successively, so that a sensor signal for each loop is updated on each scan at a rate determined by the scanning rate. In some examples, each sensor signal is thereby updated approximately every 6 mS.

The raw data representing the sensor signal magnitudes are supplied from the detector electronics 21 over a serial or parallel data link to processing unit 22 in which the data is processed to derive the required traffic information. Aspects of the present invention are particularly concerned with the signal processing which may be performed by the processing unit 22.

Processing unit 22 may be constituted by a digital data processing unit having suitable software control. It will be appreciated that many aspects of the present invention may be embodied by providing the appropriate control software for the processing unit In FIG. 2, the illustrated installation also includes remote reporting equipment 23 arranged to receive the traffic information derived by the processing unit 22 over a serial link.

Figure 3:
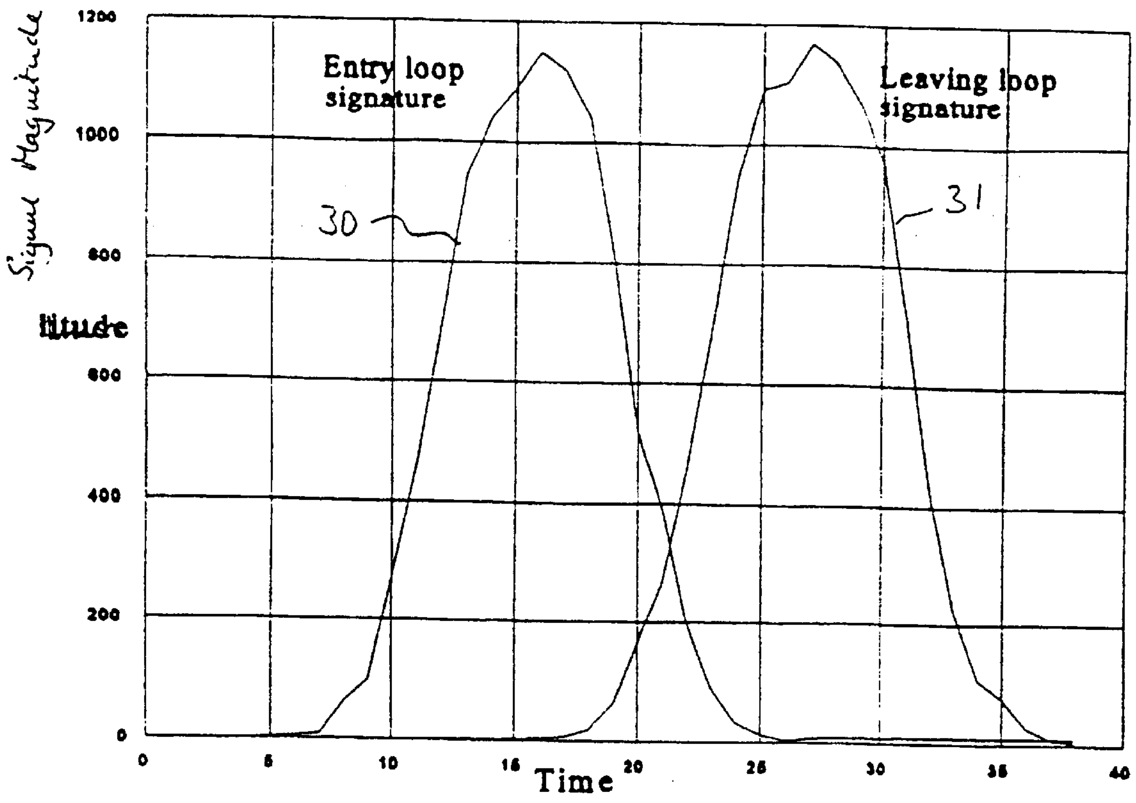
FIG. 3 is a graphical illustration of the sensor signals produced by both entry and leaving sensors in one lane of the installation illustrated in FIG. 1.

Referring now to FIG. 3, the variation in sensor signal magnitude for both entry and leaving sensor loops is illustrated graphically for a relatively short vehicle. Time is shown along the x axis and the illustrated sensor signals, or profiles, are provided assuming a vehicle has past over the entry and leaving loops at a substantially uniform speed. The y axis is calibrated in arbitrary units representing, in this example, the correction count contained in the phase locked loop control circuitry driving the respective loops. The signal profile (or signature) from the entry loop is shown at 30 and the signal profile or signature from the leaving loop is shown at 31.

Figure 4:
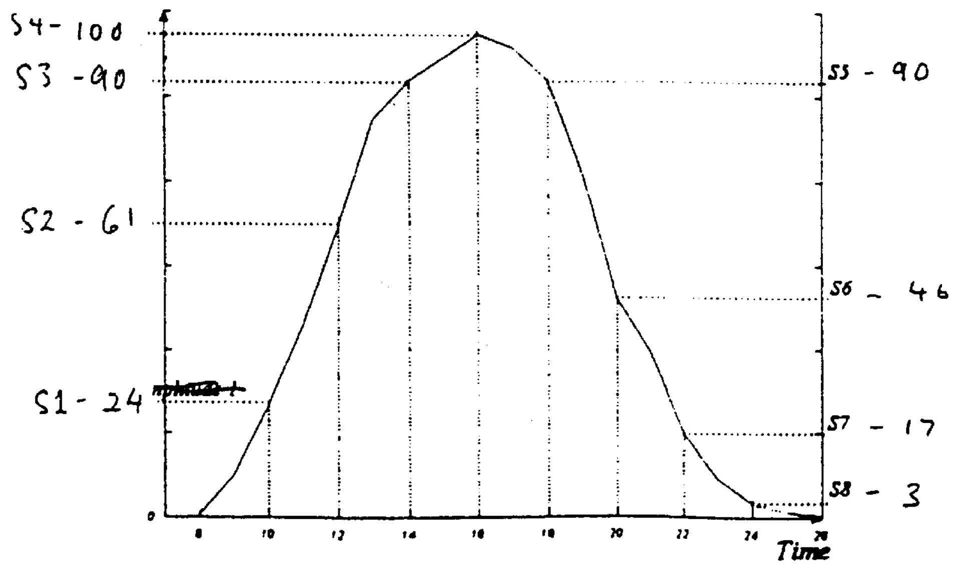
FIG. 4 is a graphical illustration showing how the sensor signal magnitude can be normalized relative to the maximum amplitude of a signal.

FIG. 4 illustrates how the profiles from a particular loop as illustrated in FIG. 3 can be normalized with respect to a maximum amplitude value. In the illustrated example, the sensor profile or signature has a single maximum. If this is set at a normalized value, 100, then the normalized values at the other sample points illustrated in FIG. 4, can be calculated by dividing the actual magnitude value at these points by the magnitude value at the point of maximum amplitude and multiplying by one hundred. If the profile has two or more maxima or Deaks, then the largest is used for normalizing.

Providing normalized magnitude values in this way is useful in performing various aspects of the present invention as will become apparent.

Referring now again to FIG. 1, a significant problem with sensor installations as illustrated is the possibility of double detection. A vehicle passing squarely over the detection loops in its own lane produces a significant sensor signal magnitude only from the loops in its lane. Referring to FIG. 1, vehicle 15 will produce a significant sensor signal magnitude only in entry loop 11 and leaving loop 12 in lane 1, while vehicle 16 will produce significant sensor signals magnitudes only in entry loop 13 and leaving 14 in lane 2. However, a vehicle passing the detector site in some road position between lanes may produce substantial sensor signal magnitudes in the loops in both lanes. For example, vehicle 17 will produce signal magnitudes in all four loops. This leads to a difficulty in discriminating between the case of two cars simultaneously passing over the two adjacent sets of loops (e.g. class cars 15 and 16 in FIG. 1) and the case of a single car passing at some position between the detector loops (e.g. vehicle 17 in FIG. 1). In prior art installations, the signal magnitude produced by this latter case (vehicle 17) would often exceed the detection thresholds of the loops in both lanes. It is important for many applications of vehicle detection that these two cases be correctly recognized. A single vehicle being detected in two lanes is termed a "double detection".

In order to differentiate between these two cases, the processing unit 22 in FIG. 2 is arranged to measure the peak amplitudes of the signals from adjacent loops, that is the entry loops 11 and 13 or the leaving loops 12 and 14. The processing unit is then arranged to take the geometric mean of these two amplitude values and compare that mean against one or more threshold values.

It has been found that the Geometric mean of the maximum amplitudes in adjacent sensors for a double detection event tends to be substantially below the geometric mean where separate vehicles are being detected in adjacent lanes.

Generally, it may be satisfactory in some installations to use only a single threshold set at a level to distinguish between double detection and genuine two vehicle detection events. The threshold can be set empirically. A single threshold may be sufficient if the adjacent loops in the two lanes are sufficiently spaced apart so that the sensor signal magnitude from adjacent loops produced by a single vehicle between the loops is likely to be relatively low in at least one of the two adjacent loops.

However, in other installations two thresholds may be required, one set sufficiently low to identify clear double detection events with confidence, and the other threshold set rather higher to provide an indication of a possible double detection event. The processing unit is then arranged in response to a possible double detection event, where the geometric mean is only below the upper threshold and not the lower threshold, by performing other tests on the signals from the loops to confirm the likelihood of double detection. The further tests may include checking that the speed measured from the loop signals in the two lanes is substantially the same and also confirming that the measured length in the two lanes is substantially the same. Another check is to confirm that the signal profile from one of a pair of adjacent loops in the two lanes is contained fully within the profile from the other loop.

As mentioned above, it is desirable for vehicle sensor apparatus of the type defined to be used to provide a measure of the length of vehicles passing along the highway. The length of the vehicle passing over a sensor site can be determined by measuring properties of the signal profile or signature obtained from one or both of the entry and leaving loops. The length may be determined either dynamically, requiring a knowledge of the vehicle speed, or statically. Static measurements have an advantage over dynamic measurements in that they can be made in stop-start traffic conditions, while dynamic measurements require vehicle speed to be reasonably constant while passing over the sensor site. On the other hand dynamic measurements can in some cases be more accurate and reliable.

One dynamic method for determining speed relies on measuring the time between points on the leading and trailing edges of the sensor signal profile as a vehicle passes a sensor loop. Thus, the processing unit may be arranged to determine the time between predefined points on the leading and trailing edges. In one example, the predefined points may be points of inflexion on these edges. A point of inflexion is defined as the point of maximum gradient.

One method of determining the timing of the points of inflexion on the leading and trailing edges is by determining the times at either side of the inflexion point where the signature slope is somewhat less than its maximum and then finding the mid point between these upper and lower points. This method is used to avoid the effect of transient distortions of the signal profile, which may for example be caused by suspension movement of the vehicle travelling over sensor. A transient distortion could result in a single measurement of the point of maximum slope being incorrect. Several measurements could be taken at different slopes on either side of the inflexion point and then a central tendency calculation applied to these measurements to obtain the inflexion point times to be used for calculating the length of the vehicle.

In order to ensure that a point having a predetermined reduction in slope from the point of maximum slope is genuine and not due to a transient profile distortion, a further measurement can be made further along the slope away from the inflexion point to confirm that the slope reduction is sustained.

It has been mentioned above that the signal magnitude data available from the sensing apparatus may not be available continuously but only at regular time intervals corresponding to the scanning rate of the sensor energizing electronics. This can produce quantization effects so that it is not possible to obtain the timing of precise slope values on the signal profile. In this case, measurements can be made at slope segments that are close to the required slopes on either side of the inflexion and the timing of the inflexion point is then corrected for the difference between them according to the equation below:

$$\text{Time}_{infl} = \text{Time}_{low} + \frac{(\text{Time}_{high} - \text{Time}_{low})}{2} + \frac{(\text{Slope}_{low} - \text{Slope}_{high})}{(\text{Slope}_{low} + \text{Slope}_{high})} \times \text{Time}_{quantisation} \quad (3)$$

Where:

$\text{Time}_{infl}$ is the calculated time of the inflexion point;

$\text{Time}_{low}$ is the time of the mid point of the low magnitude curve segment with a reduced slope close to the required value;

$\text{Time}_{high}$ is the time of the mid point of the high magnitude curve segment with a reduced slope close to the required value;

$\text{Slope}_{low}$ is the height on the y axis of the low magnitude curve segment used for $\text{time}_{low}$;

$\text{Slope}_{high}$ is the height on the y axis of the high amplitude curve segment used for $\text{time}_{high}$; and $\text{Time}_{quantization}$ is the time interval between sensor signal samples forming the signal profile.

Figure 5:
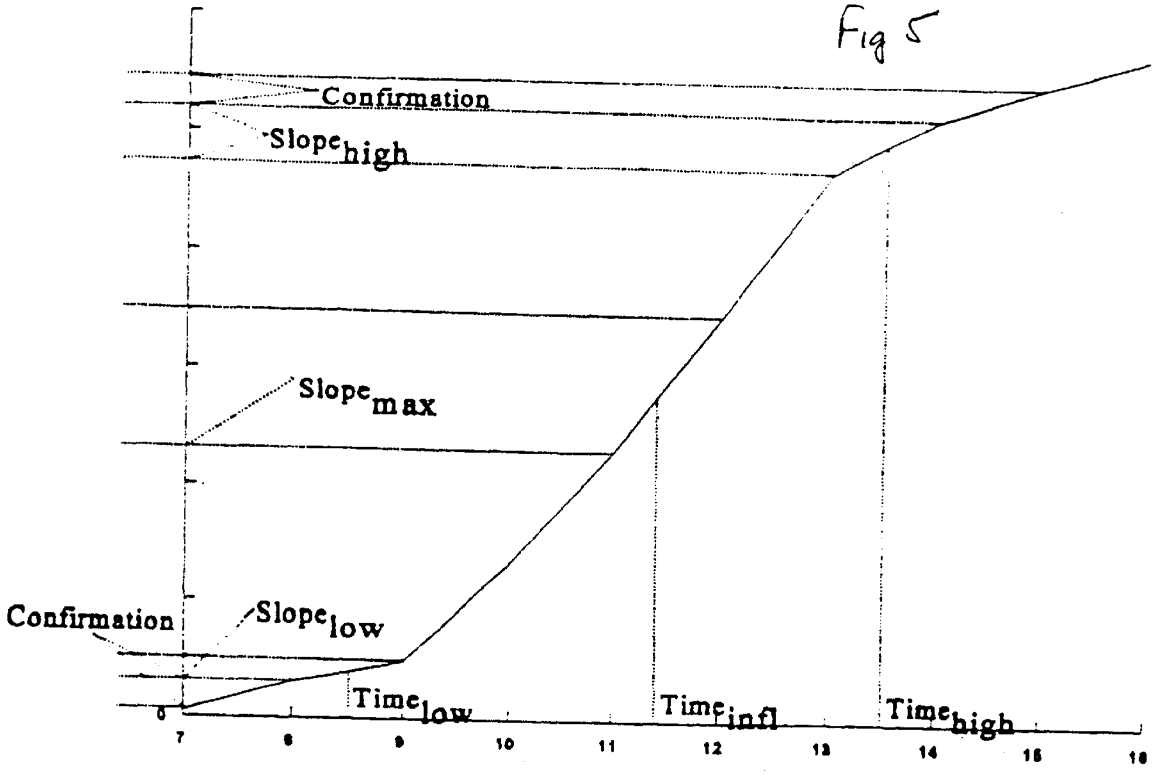
FIG. 5 is a graphical illustration of a leading edge of a sensor signal illustrating a method of determining the point of inflexion.

In order better to understand the above equation, reference should be made to FIG. 5.

For the trailing edge of the signal profile the inflexion time can be determined from the following equation:

$$\text{Time}_{infl} = \text{Time}_{low} + \frac{(\text{Time}_{high} - \text{Time}_{low})}{2} + \frac{(\text{Slope}_{high} - \text{Slope}_{low})}{(\text{Slope}_{low} + \text{Slope}_{high})} \times \text{Time}_{quantisation} \quad (4)$$

In order to improve the accuracy of the length measurement, time differences can be determined from the signal profiles of both the entry and leaving loops of an installation such as illustrated in FIG. 1.

In order to determine a value for the length of the vehicle from the elapsed time measurement made as above, it is necessary to know the vehicle speed. This may be provided separately by some other speed sensing device, e.g. a radar device synchronized with the loop sensors. However, more preferably, the speed will be derived also from the loop sensor signals in various ways as will be described later herein.

It may be appropriate to modify the length measurement obtained directly from the product of the measured elapsed time and speed by adding an empirically derived correction constant. Other empirically derived corrections to the length calculation may also be made to improve accuracy.

Instead of measuring the elapsed time between inflexion points on the leading and trailing edges of a signal profile, the signal processing unit may instead be arranged to measure the time between points on the respective edges at which the sensor signal has a magnitude which is a predetermined fraction of the nearest adjacent high signal magnitude. The "high signal magnitude" is defined as the magnitude at the nearest minimum in the modulus of the gradient of the profile. In a case where the signal profile is as illustrated in FIG. 4, the first point at which the modulus of the gradient reduces to a minimum value and then rises again (is at a minimum) is in fact at the maximum amplitude of the signal profile. At this point, of course, the modulus of the slope falls to zero before it rises again (as the slope becomes negative). However, it has been observed that the signal profiles generated by larger vehicles may have one or more "shoulders" in the leading or trailing edges of the profiles, such as is shown in the leading edge of the profile illustrated in FIG. 6. These shoulders occur in larger vehicles because the vehicle is magnetically non uniform. The shoulder may represent a point in the signal profile where a first peak would have occurred, but the influence of a more distant but magnetically larger element of the vehicle approaching the sensor loop has overwhelmed the local effect on the loop. It has been found desirable in determining the length of such vehicles from the leading and trailing edges of the signal profile produced, to take account of these initial effects resulting from the front or rear of the vehicle first entering or leaving the sensor loop.

Figure 6:
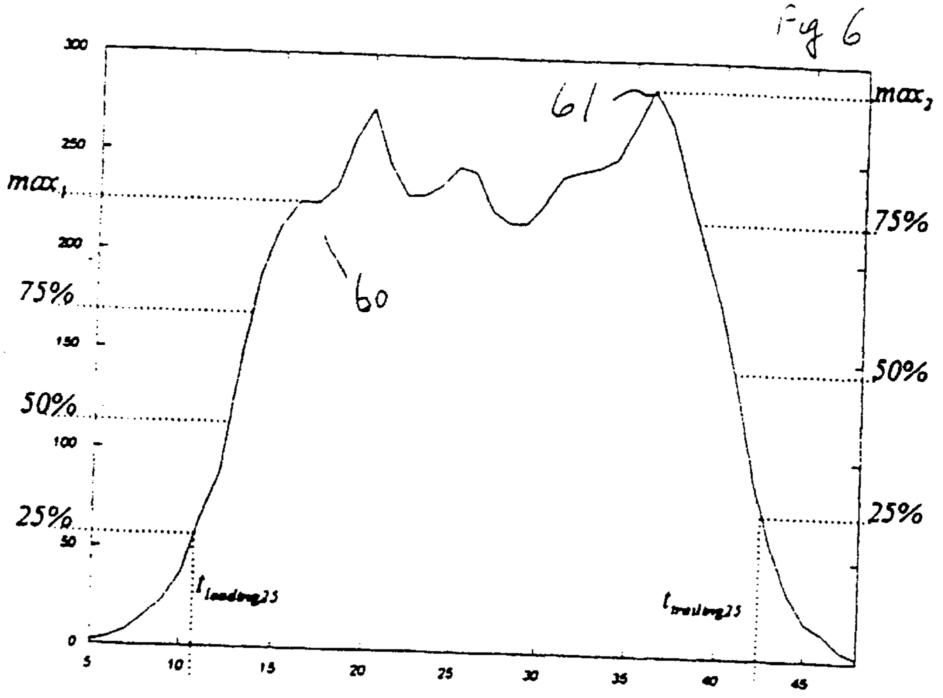
FIG. 6 is a graphical illustration of the sensor signal produced by a relatively long vehicle passing the sensor.

It will be seen that in the case of a shoulder as indicated at 60 in FIG. 6, the gradient of the leading edge declines from a maximum value to a minimum slope at point 60 before increasing again. Thus, at point 60 the modulus of the slope has a minimum at point 60.

It has been found useful to take note of shoulders in the leading or trailing slopes of the profile only if the shoulder is of sufficient significance in relation to the whole edge up to the first magnitude maximum or peak. With this in mind, a shoulder is taken into consideration only if it involves a significant reduction in the slope of the edge, to approximately 25% or less than the maximum slope on the edge, and if the shoulder point is at a signal magnitude that is a substantial portion of the nearest signal peak, approximately 65% or more. Also the shoulder is taken into consideration only if the slope is of significant duration for example continues to be less than 35% of the maximum slope for at least 15% of the total duration of the edge up to the first peak. Also, it is important that the shoulder is detected in the signal profiles from both the entry and leaving loops.

Shoulders need only be considered when the application needs to measure the length of longer vehicles with high accuracy. Otherwise the first and last peaks greater than 15% of the overall maximum can be considered as the high signal magnitude.

Where a shoulder is taken into consideration, the magnitude of the signal value at the shoulder (the high signal magnitude) is taken to be the magnitude at the point of minimum slope on the shoulder.

In this method of determining the length of the vehicle, the selected points on the leading and trailing edges between which the time duration is measured are selected to have magnitudes which are the same fraction of the nearest peak or shoulder. Thus, looking at FIG. 6, the time duration is determined between a first point at time $t_{leading25}$ and a second point at time $t_{trailing25}$. The first point is when the signal magnitude on the leading edge reaches 25% of the magnitude at the shoulder 60. The second point is when the signal magnitude on the trailing edge declines to 25% of the magnitude at the adjacent peak 61. The length of the vehicle is then taken to be the time between these two points ($t_{length25}$) multiplied by the measured speed of the vehicle.

25% is considered to be a fraction which can best relate to precisely when the front or rear of a vehicle crosses the center point of the respective loop. If other fractions are used to determine the time measuring points, corrections may be built in to the calculation used for the length. The most appropriate fraction and correction to be used can be determined empirically. Further empirically derived corrections may be made to the calculated length as required. Also, the time spacing between points at several different fractions of the nearest peak or shoulder on the leading and trailing edges of a single profile can be measured and each corrected in accordance with appropriate empirically derived factors and constants. The various length measurements thereby determined can then be combined to provide a measure of central tendency. In addition measurements may be made from the sensor signal profiles from both the entry and leaving loops.

To provide further confidence in the resulting value, a shoulder or a maximum amplitude value in a signal profile is used in the calculation only if it is found to be present in the signals from both the entry and leaving loops. For this purpose, if the normalized magnitude at the shoulder or peak is within 10% of the same value in the profiles from the two loops, then the shoulders or peaks in the two profiles are considered matched.

It is also possible to determine the length of a vehicle from a single signal profile by deriving empirically a function which relates the shape of the profile to vehicle length. It is necessary to normalize the signal profile relative to the amplitude of the highest peak of the profile. The signal processing unit can then be arranged to determine the normalized magnitude values of the signal profile at a series of times along the profile which, knowing the speed of the vehicle, corresponds to predetermined equal distances in the vehicle direction of travel. These normalized magnitude values at the predetermined incremental distances along the profile can then be inserted into the empirically derived function stored in the processing unit in order to derive a value for the vehicle length. In performing this calculation, it is preferable to ignore magnitude variations in a single signal profile between first and last peaks or high signal magnitudes of the profile and so it is convenient to set the magnitude value between the peaks at the normalized value for one or other of the peaks, so as to reduce the complexity of the empirically derived function.

Figure 7:
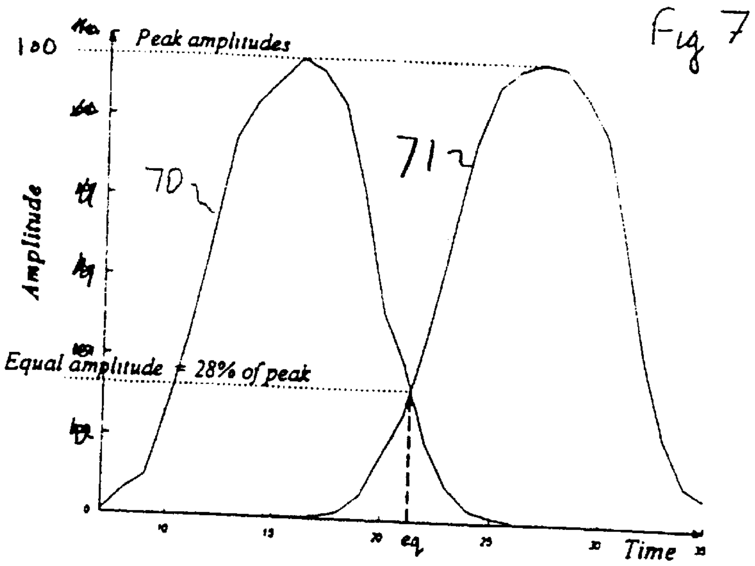
FIG. 7 is a graphical illustration of a method for determining the length of a vehicle from the overlap between the sensor signals from two successive sensors in a single lane.

Another method of determining the length of a vehicle uses the signal profiles from both the entry and leaving loops. Referring to FIG. 7, the entry and leaving loops 70 and 71 are shown overlapping at a $time_{eq}$. It has been found that the value of the magnitude of the profiles at the point in time when these magnitudes are equal is approximately linearly related to the length of vehicle. Preferably, the normalized profile magnitudes are used to find the point of equality on overlap of the trailing and leading edges. Thus the equal magnitude point illustrated in FIG. 7 is at 28% of the peak amplitude of each of the profiles 70 and 71. It should be appreciated that although the profiles 70 and 71 are shown to have identical peak amplitudes in FIG. 7, these are in fact the normalized profiles and the actual magnitudes of the two peaks need not be precisely the same. Variations may occur due to differences in the installation of the entry and leaving loops or due to suspension movement of the vehicle when crossing the loops, or to other causes.

In the case of a loop installation such as illustrated in FIG. 1, it has been found that the vehicle length ($length_{eq}$) can be related to the equal magnitude value at the point of overlap of the profiles ($level_{eq}$) by the equation:

$$Length_{eq}=3+Level_{eq}\times4(\text{meters})$$

where $level_{eq}$ is expressed as a fraction of unity (e.g. 0.28 for the example of FIG. 7).

The above described technique for determining the length of a vehicle has the advantage of providing a length measurement irrespective of the speed of the vehicle passing the sensors. In practice, the processing unit is arranged to record magnitude values from the two sensor loops at least over the full trailing edge of the signal from the entry loop and the full leading edge of the signal from the leaving loop. Then the necessary calculations can be done to normalize the magnitude values once all the values have been recorded, irrespective of the speed of the vehicle and the corresponding time taken for the signals to decline back to the base value.

Figure 9:
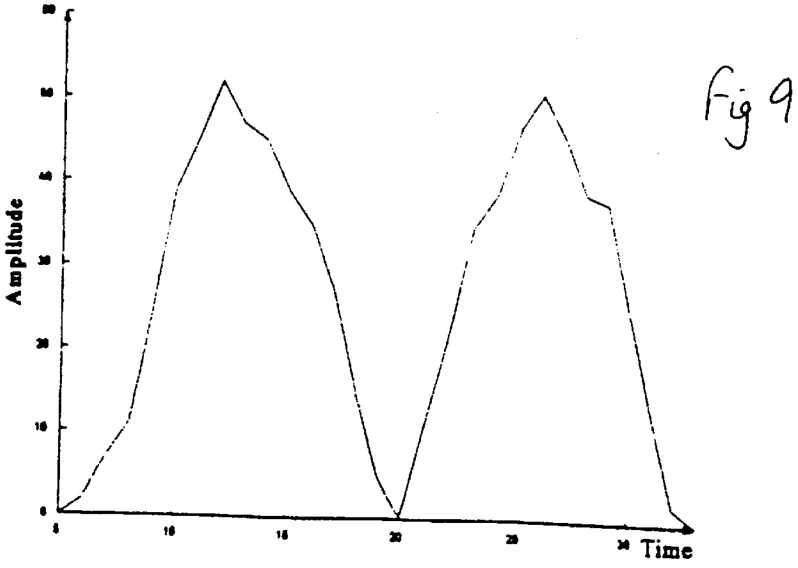

It can be seen that the above described method of determining the vehicle length can work only in cases where the trailing edge of the entry loop signal and the leading edge of the leaving loop signal do in fact overlap to produce an intersection point. This will generally occur only for relatively shorter vehicles. The minimum vehicle length which can be measured in this way corresponds to the minimum vehicle length which continues to produce a signal in both the entry and leaving loops as the vehicle travels between the two. If the vehicle is too short there is a point at which there is no signal detected in either loop so that, as shown in FIG. 9, the trailing and leading edges of the two profiles do not overlap. This corresponds to $level_{eq}$ from the above equation being zero.

Figure 8:
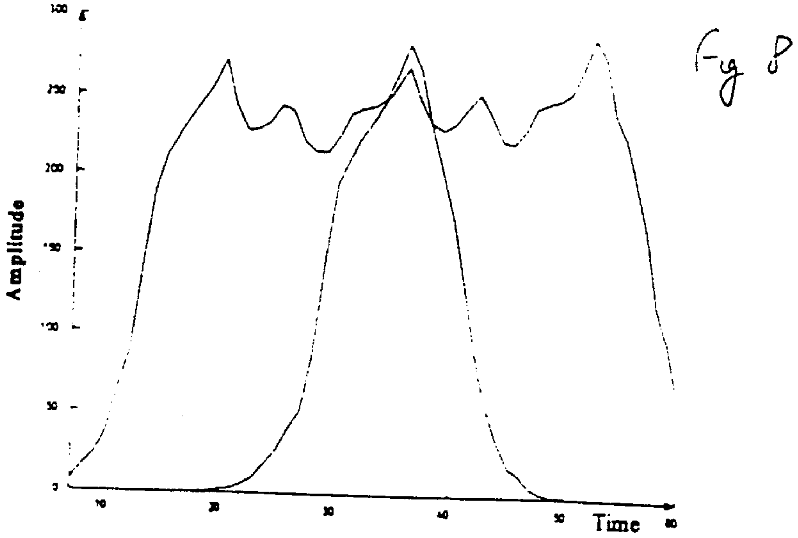
FIGS. 8 and 9 illustrate respectively the sensor signals for vehicles which are either too long, or too short for the length to be determined by the method illustrated in FIG. 7.

The maximum vehicle length which can be measured is as represented in FIG. 8 where the last amplitude peak in the signal profile from the entry sensor coincides with the first amplitude peak of the signal profile from the leaving sensor, so that again there is no point of intersection between the trailing and leading edges of the profiles. This corresponds to $level_{eq}$ having the value 1 in the above equation. Thus, for an installation corresponding to that shown in FIG. 1, the above method is capable of measuring vehicle lengths only between three and up to about seven meters. Nevertheless, for shorter or longer vehicles, the method can still provide an indication of the maximum or minimum length respectively.

Figure 10:
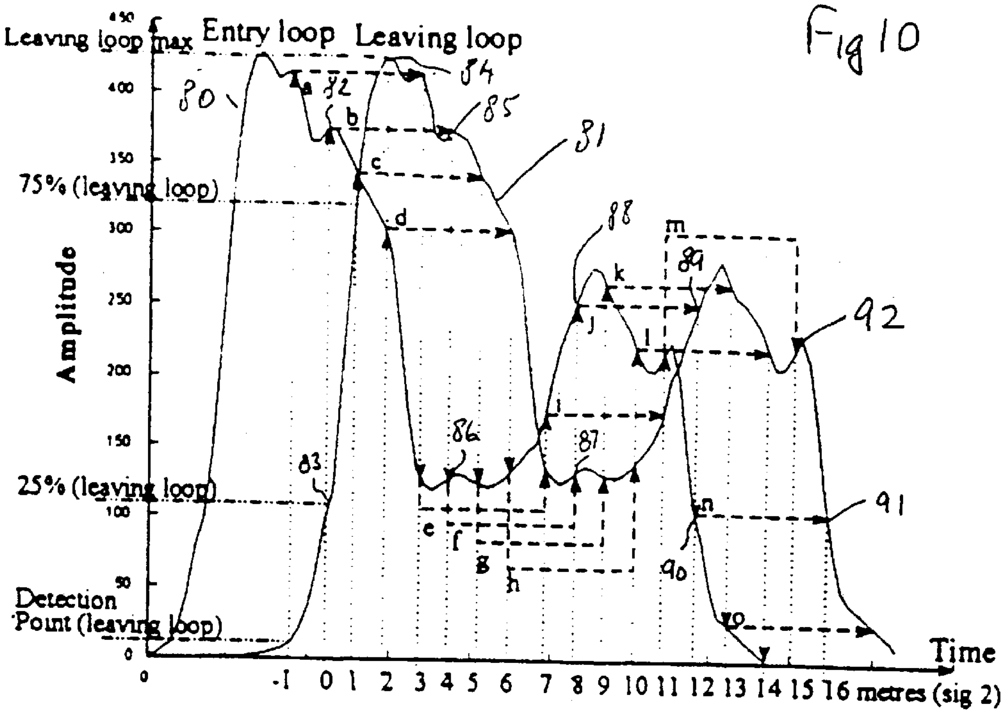
FIG. 10 is a graphical illustration showing how the length of a relatively long vehicle can be determined by repeatedly comparing points on the signal profiles from the two sensors in a single lane of the highway.

Another method of measuring the length which can be used for relatively longer vehicles and which also does not require a speed measurement is illustrated in FIG. 10.

This method relies on the empirical knowledge of the spacing of the entry and leaving loop centers and that the leading edge of a signal profile between the point of first detection of a vehicle and the first maximum amplitude (or substantial shoulder as defined before) corresponds to a reasonably predictable total distance of movement of the front of the vehicle for any particular installation.

For example in an installation corresponding to that shown in FIG. 1, a vehicle is first detected when the front of the vehicle is typically 1 meter from the center of the entry loop, that is approximately over the front edge of the entry loop. When the front of the vehicle is directly over -he center of the entry loop (that is overlapping the loop by 1 meter from the front of the loop) the signal from the loop has a normalized magnitude of 25% of the adjacent peak amplitude. The signal magnitude reaches 75% of the peak when the front of the vehicle is aligned over the rear edge of the entry loop and the first peak in the profile is reached when the front of the vehicle is 1 meter beyond the rear edge of the loop, in fact at the mid point between the entry and leaving loops of the installation of FIG. 1.

The above determinations are made empirically for any particular loop installation and the appropriate values can be determined for any particular installation.

The position of the front of a vehicle relative to the mid point of the leaving loop is shown along the x axis of FIG. 10, which illustrates the signal profiles from entry and leaving loops 80 and 81 respectively, corresponding to a relatively long vehicle.

In order to perform the length measurement technique illustrated in FIG. 10, the processing unit is arranged to record the magnitude values of the sensor signals from both the entry and leaving sensors. The magnitude values for the two profiles recorded at substantially the same times are correlated. Thus, for example, it is possible to determine the magnitude value of a point 82 on the entry loop profile 82 which corresponds in time with a point 83 on the leading edge of the leaving loop profile 81 which has a magnitude at 25% of the amplitude of the adjacent peak 84 on the profile 81.

The processing unit is then further arranged to provide a profile correlating function which can compare the profile of the entry and leaving loop signals to identify points on the profile of one loop which correspond in terms of profile position to points on the profile from the other loop. This is possible because the processing unit has a record of the signal magnitude value for both profiles. It is therefore straightforward for the processing unit to track through its record of magnitude values for one profile to identify a point in the profile which corresponds to any particular point in the other profile.

Thus, once the point 82 on the entry loop profile in FIG. 10 has been identified, the corresponding point 85 on the leaving loop profile can be determined by profile correlation. It should be understood that, whereas point 82 is time correlated with point 83, i.e. was recorded at the same time, point 85 is profile correlated with point 82, i.e. was recorded at a different time but is in the co-responding position in the two profiles.

The shift between the points 82 and 85 corresponds to a shift along the length of the vehicle equal to the distance between the centers of the entry and leaving loops, 4 meters in the example of FIG. 1. Thus, the point 85 on the leaving loop profile corresponds to a position where the center of the leaving loop is 4 meters from the front of the vehicle.

Having identified the point 55, the processing means can now perform a repeat time correlation to identify the time correlated point 86 on the entry loop profile which was recorded at the same time as point 85 on the leaving loop profile. This newly identified point 86 on the entry loop profile may again be profile correlated with a point 87 on the leaving loop profile. This point 87 now corresponds to the center of the leaving loop being 8 meters from the front of the vehicle.

The point 87 may again be time correlated with a point 88 on the entry loop profile and the point 88 once again profile correlated with a point 89 on the leaving loop profile. This point 89 now corresponds to the center of the leaving loop being 12 meters from the front of the vehicle. One further iteration of time correlation to point 90 and profile correlation to point 91 identifies a point on the leaving loop profile which corresponds to the front of the vehicle being 16 meters in front of the center of the leaving loop.

At this point, the processing unit can determine that point 91 is in fact on the trailing edge of the leaving loop profile and can also determine the normalized magnitude of the point 91 relative to the immediately preceding peak amplitude on the profile. For example, in the example of FIG. 10, point 91 is at approximately 46% of the amplitude at peak 92.

From an empirical knowledge of how the trailing edge of a profile relates to the position of the tail of a vehicle, the processing unit can make a further calculation to determine an additional length component to be added to the 16 meters already determined for the length of the vehicle. In an installation corresponding to that shown in FIG. 1, a suitable additional component can be calculated as (46−25)/50=0.42 meters.

Accordingly, the overall length of the vehicle can be calculated as 16.42 meters.

An additional constant correction may be applied derived by empirical testing.

It may be appreciated that the above procedure may be repeated for a number of different starting positions on the leading edge of the leaving loop, with an appropriate correction being made for the empirically derived position of the point of starting the measurement from the center of the leaving loop. The various measurements derived may be combined to obtain a value for the central tendency.

Also, although the process has been explained by starting with a predetermined point on the leading edge of the leaving loop, the process could also be performed by starting with a predetermined position on the trailing edge of the entry loop and working forward in time along the profiles until reaching a point on the leading edge Of the entry Loop.

Importantly, the above procedure can be performed irrespective of the speed of the vehicle. The profile correlation can be performed using only the way in which the magnitude values of each of the two profiles varies.

Figure 11:
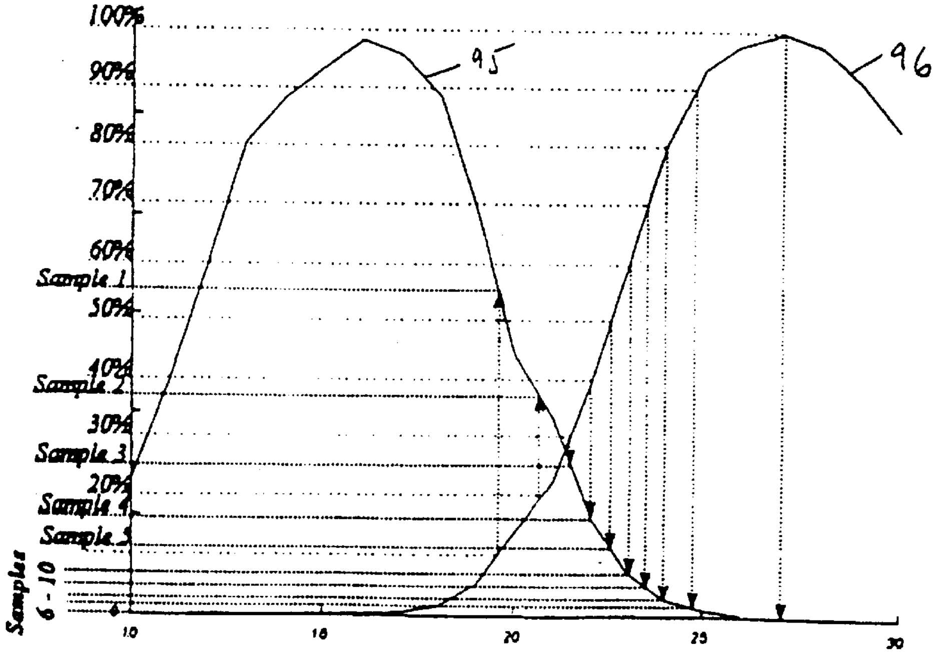
FIG. 11 is a graphical illustration showing a more accurate method of using the overlap between successive sensor signals to determine vehicle length.

A further static method for determining vehicle lengths is illustrated in FIG. 11. In this method, the processing means is arranged to record the magnitude values for the profiles from the entry and leaving loops 95 and 96, at least from the amplitude peak or high signal magnitude of the entry loop profile 95 over the trailing edge of the profile, and over the leading edge of the leaving loop profile 96 up to its first amplitude peak or high signal magnitude. Then, the normalized magnitude values in the trailing and leading edges of the two profiles at a number of different time points are measured. These pairs of normalized magnitude values taken at individual time points can be used directly to derive a value for the length of the vehicle.

In a simplified form, the time points are determined to correspond with predetermined normalized amplitude values on one of the two edges. Then it is necessary only to record the normalized magnitude values at these time points on the other of the two edges and use these values in an empirically derived function to provide a value for the vehicle length.

In the example illustrated in FIG. 11, normalized magnitude values are measured on the trailing edge of the entry loop profile 95 at times corresponding to normalized magnitude values on the leading edge of the leaving loop profile 96 of 10%, 20%, 30%, etc. up to 100%. Thus, the 10% magnitude value on the leaving loop profile 96 produces sample 1 from the trailing edge of the entry loop, the 20% value produces sample 2 and so forth. These samples can be directly introduced into an empirically derived function relating these sample values to vehicle length.

The advantage of this technique is that it is relatively insensitive to transient distortions of either profile, e.g. resulting from suspension movement of the vehicle.

If any samples are taken at a time earlier than the last peak of the profile, then these samples are set at a normalized height of 1.0 (100%) in order to reduce the complexity of the transfer function used. This can occur, for example, if the two profiles in FIG. 11 are closer together so that the 10% sample from the leading edge of profile 96 corresponds to a point on profile 95 before the peak of the profile.

It can be seen that this technique is again useful only for relatively shorter vehicles and for an installation corresponding to that in FIG. 1, the method can be used to determine lengths only between about 3 and 7 meters.

An important part of many vehicle sensing installations is to be able to handle high traffic flows and stop-start driving conditions. Existing installations are unreliable under these conditions.

The above described static methods of measuring vehicle lengths may be particularly useful in traffic monitoring in high congestion conditions. It is also important that the entry loop of a detection loop pair is cleared ready for a subsequent vehicle detection event as soon as the signal profile from the loop has declined substantially to zero, even if the signal from the leaving loop of the pair is still high. The processing unit is arranged to capture all the data from the entry loop and hold this data available for appropriate comparisons with the data from the leaving loop once this becomes available. The processing unit is simultaneously then able to record fresh signal data from the entry loop, which would correspond to a following vehicle, even while still receiving data from the leaving loop corresponding to the preceding vehicle.

Indeed, it is an overall unifying concept of the various aspects of this invention that the signal processing unit records all the signal magnitude data from the two sensors of a road vehicle sensing apparatus of the type defined with two successive sensors, and includes means for processing this data to derive vehicle characteristic information once all the data has been received and recorded. The processing unit can be arranged to separately record data from the entry sensor corresponding to a second vehicle, whilst still recording data from the trailing sensor corresponding to the first vehicle. For installations in a carriageway of a multi lane highway, the signal processing unit is also arranged to record all the signal magnitude data from the sensors in all lanes, for subsequent processing as required.

A further important characteristic of a useful road vehicle sensing apparatus is to be able to identify gaps between vehicles travelling very close together so that tailgating vehicles can be separated even when their sensor profiles overlap.

One method of detecting tailgating involves the processing unit monitoring a characteristic of the profiles of signals from the entry and leaving sensors and comparing the characteristic of a profile from the entry sensor with fric the leaving the next following profile from the leaving sensor and providing a tailgating indication if there is a substantial difference between these characteristics.

The selected characteristic may be the signal magnitude at a minimum in the profile from the two sensors.

If a minimum occurs in the profiles from the entry and leaving sensors which has a magnitude (normalized relative to the peak amplitude of the profiles) which is less than a predetermined threshold, and is substantially different in the profiles from the two sensors, then tailgating is 10 indicated. This would arise when two vehicles following closely behind one another cross the entry and leaving sensors with different spacings between the two vehicles so that the minimum signal level in the joint profiles is different from the two sensors.

It may be necessary to ensure that the detected minimum is genuine by checking also if the profile magnitude after the minimum rises above a second threshold higher than the first threshold. In one arrangement, the processing unit is arranged to consider minima only if they satisfy this criterion.

Tailgating may also be detected if there is a minimum in the profile from the entry loop satisfying the required criterion and where the profile from the leaving loop drops substantially to zero before rising again. This corresponds to the case where two vehicles are close together when passing over the entry loop but the first vehicle clears the leaving loop before the second vehicle is detected by the leaving loop.

Tailgating may also be indicated if there is a substantial minimum in the profile from the leaving loop even though the profile from the entry loop had previously dropped to zero. This would correspond to the case where a vehicle has past normally over the entry loop, clearing it before a second vehicle is detected by the entry loop, but the second vehicle then comes very close to the first vehicle before the first vehicle clears the leaving loop.

It may be necessary to make the threshold for detecting a minimum in this particular case lower than the predetermined threshold used for detecting tailgating when minima are found in the profiles from both loops. This is necessary to avoid indicating tailgating when a single vehicle having a minimum in its profile which would be normally slightly above the main threshold used for both the entry and leaving loops but is transiently below this threshold as the vehicle passes the leaving loop, e.g. due to suspension movement or other variables between the two loops.

The main threshold used for detecting minima in both entry and leaving loops can be made dependent on traffic speed. A level of 30% of the profile maximum amplitude may be satisfactory as a minimum detection threshold at low speeds, dropping to zero at speeds in excess of 7 meters per second. This can achieve a high vehicle count accuracy in most conditions. To reduce the minimum detection threshold at higher vehicle speeds is not essential for operation of the tailgating detection algorithm, but can slightly improve count accuracies at these higher speeds.

In order to determine whether minima detected in the entry and leaving sensor profiles are significantly different, a difference of about 10% in magnitude is considered sufficient.

If the method is arranged to reduce the minimum detection threshold at higher speeds, then a value or speed must be obtained. An approximate speed value can be determined by measuring the time between different predetermined normalized magnitude levels on the leading or trailing slope of a signal profile. For example, in the installation illustrated in FIG. 1, it has been shown empirically that for most vehicles, the difference on the leading edge of a profile between the signal magnitude of 25% of the nearest peak (or high level) and 75% corresponds to movement of the front of a vehicle by 1 meter. Thus, if the time between the attainment of these two values on the leading edge of a profile is measured, the approximate speed of a vehicle can be determined directly. Different calculations can be made for different selected threshold levels and in different installations.

In order to measure the speed of vehicles passing over the detector loops, the time difference can be measured between corresponding features in the signal profiles from the entry and leaving loops. Knowing the spacing of the loops in a particular installation, the speed can be calculated directly.

However, two factors can lead to the speed measured in this way being different from the actual speed of the vehicle. The First is when the road vehicle sensing apparatus produces sensor signal values at discrete sampling times, corresponding to the scanning rate between the various loops of the installation. Then, the actual time of occurrence of a particular feature in a signal profile is indeterminate by plus or minus half the sampling period (which may be 6 mS or more). This can represent a speed measurement error of about ±2½% at 70 mph using a base line corresponding to the spacing of the centers of the entry and leaving sensors of 4 meters.

The second factor introducing errors is that transient distortions of the signal profile can cause a particular profile feature being used for the speed measurement to appear slightly before or after its correct time.

The first of these factors can be addressed by interpolating between individual signal magnitude level samples received at the sampling rate, to discover the correct timing for a particular feature (e.g. a required magnitude value). In the particular case where the profile feature being used for the speed measurements is a particular signal magnitude, ordinary linear interpolation can be used to find the correct time between two samples on either side of the desired magnitude.

When the required feature on each profile is a profile peak or trough, then a form of interpolation can also be used using the differences between the intended peak or trough value and the magnitude values obtained which are closest to the peak or trough values. If the highest magnitude value obtained at the sampling rate is at time $T_1$ (or the lowest when the required feature is a trough), $S_1$ is the difference between this highest sample value and the preceding sample value and $S_2$ is the difference between the highest value and the next sample value (at time $T_2$) then the interpolated time $T_{feature}$ of the feature itself is given by:

$$T_{feature} = T_1 + (T_2 - T_1) \times \frac{(S_1 - S_2)}{(S_1 + S_2) \times 2}$$

In order to deal with the second factor producing errors in speed measurements, multiple matched profile features can be used from the two loop profiles. For example, multiple levels on leading and trailing profile edges can be timed relative to corresponding levels on the edges of the other profile and a speed measurement obtained for each matched pair. Then error theory can be used to determine the central tendency of the resulting values.

Throughout the preceding description, it should be understood that where examples of the invention have been described in relation to a processing unit or processing means arranged to perform the various functions, the examples could also be considered as methods or processes. In practice, the various aspects and features of the invention may all be provided as software algorithms controlling a suitable data processing unit.

The invention contemplated herein is constituted not only by a signal processing apparatus for processing said signals from a road vehicle sensing apparatus of the type defined preferably for a multi lane highway and with two successive sensors in each single lane, but is also constituted by a road vehicle sensing apparatus in combination with the signal processing apparatus described.

There follows a description of the software structure which may be created to implement the various processing steps described above. The following description is made in terms of various software modules, forming State Machines, which will be understood by those familiar with programming techniques.

1. SYSTEM OPERATION

Figure 12:
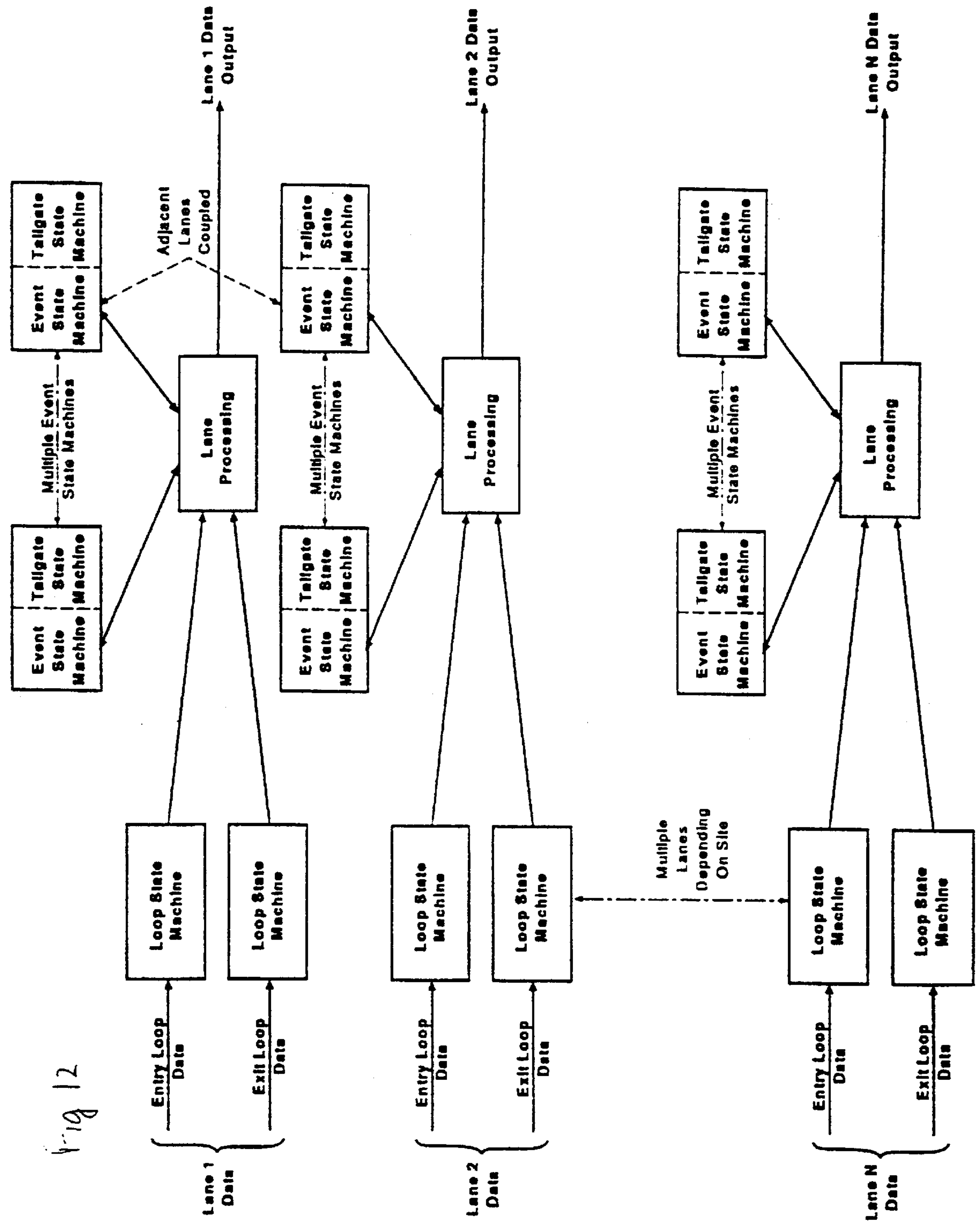
FIG. 12 is a schematic diagram illustrating a software structure implementing an embodiment of the present invention.

Referring to FIG. 12, the system takes data from loop detectors, conditions the data via a Loop state machine if required, and processes the data from loop pairs in each lane to determine events that represent the passage of vehicles over each lane's detector site. The purposes of each element in FIG. 12 are:

Loop State Machine:

- To condition the data from each loop, for example to subtract any residual baseline from the data, to apply gain variation if the sensitivities of the loops varies, to track the baseline if it drifts.
- To detect if a loop has entered a fault state.
- The nature of the loop state machine, and the need for such will depend entirely on the nature of the detectors used.

Lane Processing:

- To manage the event state machines receiving data from the loop pair in a lane.
- To direct the data from the loops in a lane to the appropriate event state machines, as determined by the operation of those state machines.
- To maintain configuration information for each lane, for example the dimensions of the detection site.

Event State Machine:

- To receive data from a loop pair in a lane and determine when vehicles have passed over the site.
- To interact with a Tailgating state machine to determine when a signature indicates that two vehicles are tailgating.
- To interact with the Event state machines handling the data for the lanes on each side (if there are such lanes), to determine when a vehicle is straddling the two lanes.

Tailgate State Machine:

- To determine when a signature indicates that two vehicles are tailgating.
- To determine the point in the signature where it must be split so that there are separate signatures for each of two vehicles that are tailgating. This must be done for both loops in a lane if both loops display tailgating signatures.

The input data is normally samples of the output from the loop detectors taken at regular intervals, although other presentations can be provided. The output data depends on the nature of the application, but may be:

- Records describing each vehicle passing over the site, for example the speed, length, time over each loop, time at which the vehicle started and ended its site traversal, and the signature of the vehicle over each loop.
- A summary of the traffic over the site during a period.
- An alarm for vehicles meeting certain criteria such as speed or length.
- Other data as required.

In operation, data is received and conditioned by the Loop state machines, and passed to the event state machine for examination.

There are multiple event state machines simultaneously available for each lane, and several may be actively processing events in each lane at any time. The need for multiple machines can be understood by mentally following the progress of vehicles over the detection site. Consider the case of two vehicles travelling close one behind the other in a lane. As the first passes over the site and is proceeding over the exit loop, the second may already be starting to pass over the entry loop. Since the purpose of an Event state machine is to track the progress of a vehicle from entry onto the site until it is completely clear of the site, it can be seen that in this case two state machines are required. One is handling the vehicle currently moving off the site, and one the vehicle currently moving onto the site.

The possibility of vehicles straddling between lanes increases the need for more active Event state machines, particularly where there are more than two lanes in a carriageway. Suppose on a three lane carriageway that there is a long vehicle with three cars at its side, and all are straddling lanes because of an obstruction. It is not possible to be sure that the truck is not several tailgating vehicles until it has completely passed over the detection site, and all of the cars alongside must remain part of the double detection configuration until the last of the four vehicles is off the site, when the whole configuration can be fully evaluated. All of the state machines must remain active until this time, so more are needed.

The operation of the Event state machines depend on the data presented, previous data presented, the states of the state machines handling the lanes on either side, the mode of the system, and the state of the loop detectors. The Lane Processing module directs loop data to the appropriate state machine under direction from the Event state machines themselves, which decide which loops in a lane each should be receiving data from, depending on the signature presented.

The Event state machines are associated with a Tailgate state machine when they are active, and pass information to their Tailgate state machine so that it can determine if tailgating is occurring. The relevant information is the locations of maxima and minima in the data, and when the loops drop out of detection.

If the Tailgate state machine determines that tailgating is occurring, it will split the signatures obtained by its associated Event state machine at the appropriate point. Frequently it will be necessary for a Tailgate state machine to find an unused Event state machine to move part of the signature to. It then sets the states of the Event state machines to be compatible with the new view of the data and directs loop data to the appropriate Event state machine. Following this the processing of data proceeds as normal.

Following sections describe the operation of Event and Tailgate state machines. The loop state machine is not described because it is dependent on the particular detectors used.

2. THE STATE MACHINES

2.1 The Event State Machine

Figure 13A:
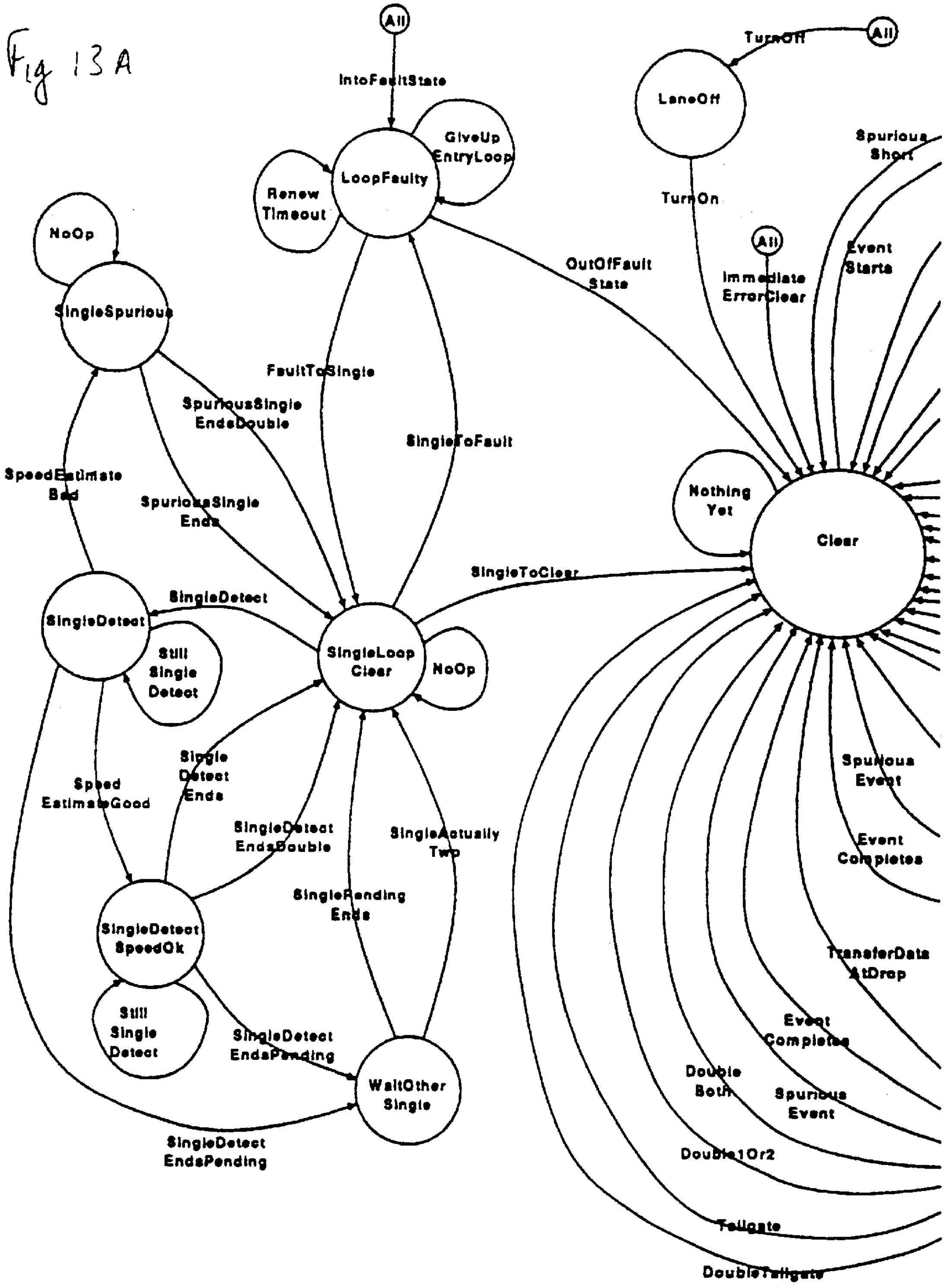
FIGS. 13A and 13B together constitute the transition diagram of the Event State Machine of the structure illustrated in FIG. 12.
Figure 13B:
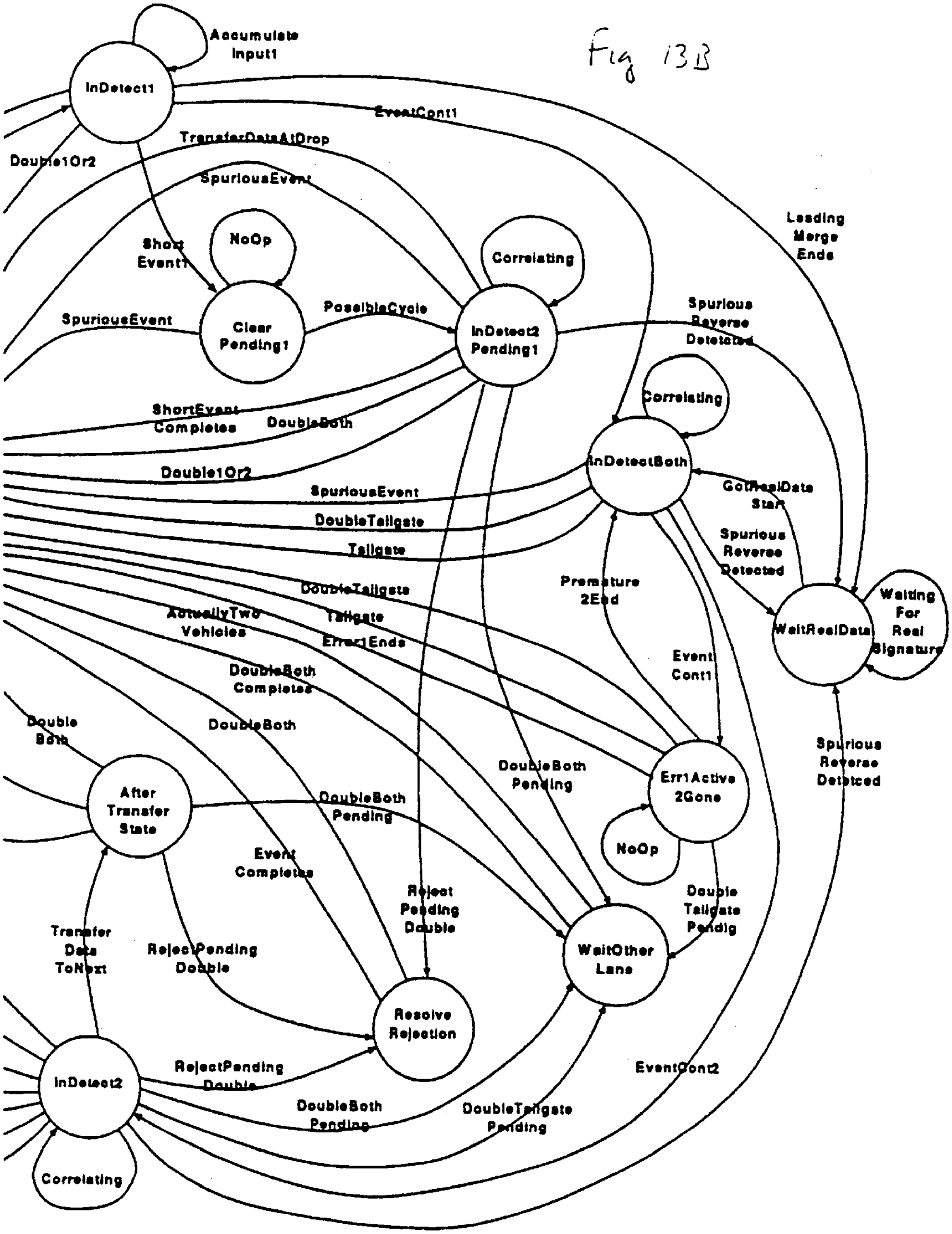

FIGS. 13A and 13B from the transition diagram for the Event State Machine.

2.1.1 Description of States

Notes:

1. An "event" is a sequence of individual loop detections indicating the passage of a vehicle over or near one or both of the loops in a traffic lane.

2. The "first" loop in an event is usually the entry loop. It will be the exit loop when a vehicle is traversing the site in reverse. Similarly the "second" loop is usually the exit loop.

3. A double detection "configuration" consists of a set of adjacent lanes simultaneously processing events that meet the criteria for possible lane straddling vehicles, such that each lane considers one or two of the adjacent lane events as a potential straddling "partner". Such a configuration is "completed" when all of the events in the configuration have individually completed.

4. An individual event has "completed" when both loops have gone out of detect and the state machine is not in the "ClearPending1" state, or a tailgating event has been determined as occurring and both loops have been switched to the following event.

Clear:

The state machine is in the Clear state when it is operating normally and no detection is occurring.

InDetect1:

The state machine is in the InDetect1 state when a detection is registered on a single loop indicating that a vehicle is starting to traverse the site. Normally the detection is on the entry loop, but if a reverse event is occurring, it will be over the exit loop.

InDetectBoth:

The state machine is in the InDetectBoth state when a vehicle is being detected by both loops as it traverses the site.

InDetect2:

The state machine is in the InDetect2 state when a vehicle is being detected by the second loop only, completing its traversal of the site.

ClearPending1:

The state machine is in the ClearPending1 state when a detection has occurred on the first loop which has subsequently dropped out of detect before the second loop has been activated. This may occur, for example, if a very short vehicle is traversing the site or if the loops are widely separated lengthwise.

InDetect2Pending1:

The state machine is in the InDetect2Pending1 state when a detection occurs on the second loop after the ClearPending1 state, and usually indicates that a short vehicle is traversing the site.

Err1Active2Gone:

The state machine is in the Err1Active2Gone state when both loops have been normally activated, and the second then drops out before the first. This can indicate an error condition, or that an unusual configuration of vehicles has occurred.

WaitOtherLane:

The state machine is in the WaitOtherLane state when one or more double detections is occurring (that is, there may be a vehicle straddling two lanes), and at least one of the other lanes in the configuration has not individually completed.

LoopFaulty:

The state machine is in the LoopFaulty state when one or both loops in a lane have been determined as faulty. The state machine will stay in the LoopFaulty state only if both loops remain faulty.

LaneOff:

The LaneOff state is provided to enable the state machine to be configured to ignore all data.

WaitRealData:

The state machine is in the WaitRealData state when it has determined that adjacent lane spillover signals are merged with a genuine in-lane detection on the first loop of a lane, and we have to wait for the in-lane detection to start on the other loop.

AfterTransferState:

The state machine is transiently in the AfterTransferState state when it has been determined that a tailgating event has occurred from the second loop data only, and parts of the current signature have been transferred to another state machine instance for further processing. The disposition of the current event data left with this state machine instance is then determined from the AfterTransferState state.

ResolveRejection:

The state machine is transiently in the ResolveRejection state when a member of a double detection configuration has been subsequently determined as being a separate event, and no longer part of the configuration. When this happens, decisions need to be taken about whether events can now complete, or whether there are still other members of the configuration to complete, and these decisions are taken in this state.

SingleLoopClear:

The state machine is in the SingleLoopClear state when one loop of a pair in a lane is faulty and the other operational, and there is no detection currently occurring. When one loop is operational and the other faulty, the lane is operating in "single loop mode"

SingleDetect:

The state machine is in the SingleDetect state when a detection is occurring in single loop mode, and a good speed determination has not yet been made.

SingleDetectSpeedOk:

The state machine is in the SingleDetectSpeedOk state when a detection is occurring in single loop mode and a good speed determination has been made.

WaitotherSingle:

The state machine is in the WaitotherSingle state when in single loop mode and the event is part of a double detection configuration, and one or more of the other members of the configuration have not yet completed.

SingleSpurious:

The state machine is in the SingleSpurious state when in single loop mode and a bad speed determination has been made, and the event is to be rejected as spurious, but the loop is still detecting.

2.1.2 Description of Transitions

Noop: Do nothing

Activated when: There is nothing to be done i.e. In the states: Clear when there is no new data from the detector;

ClearPending1 when neither loop is detecting, and the timeout is not yet reached;

singleLoopClear when there is no new data from the detector; LoopFaulty when both loops have gone out of fault state but the anti-toggling timeout has not been reached;

Err1Active2Gone when the state of the second Loop being not detecting and the first detecting is maintained, and no fault condition has been detected.

Associated action: None

NothingYet: No vehicle is being detected

Activated when: The state machine is in one of the clear states (Clear and SingleLoopClear), and new data arrives from the detection loops.

Associated action: None.

AccumulateInput1: Accumulates the signature of this event when the first loop is detecting.

Activated when: The state machine is in the InDetect1 state and new input arrives showing the first loop is still detecting and the second is not detecting.

Associated action: The new data for the first loop is accumulated as a new element of the signature of this detection. If a maximum or minimum occurs in the signature, a check is made for evidence of tailgating.

EventStarts: Register the start of a new event when the first loop detects.

Activated when: The state machine is in the Clear state and the amplitude of the signal from the first loop reaches the detection threshold.

Associated action: The current time is recorded as the event start time, and the data value for the first loop starts the event signature. If the detection occurs on the entry loop, the direction of the event is set to normal and the entry loop is set as the first loop, and if the detection occurs on the second loop, the direction is set to reverse, and the exit loop is set as the first loop. If the first and second loops are currently being processed by different state machines and the state machine that was previously processing this lane is in the ClearPending1 state and the state machine processing the second loop is in the state or InDetect2 or InDetect2Pending1, then the second loop state machine is checked for the existance of tailgating. If there is evidence of tailgating, the second loop state machine is completed. If there is not, the previous state machine is forcibly cleared, and its data discarded.

EventCont1: Register the change from the first loop detecting alone to both loops detecting.

Activated when: We are in the InDetect1 state and the amplitude of data from the second loop goes above the detection threshold, or we are in the Err1Active2Gone state and the second loop detects again.

Associated action: The detection time of the second loop is set to the current time, and the data value for both loops is added to the event signature. If a maximum or minimum occurs in the signature, a check is made for evidence of tailgating.

EventCont2: Registers that the first loop has now ceased detecting, and that the second is still detecting.

Activated when: We are in the InDetectBoth state and the first loop goes out of detect and the second is still detecting.

Associated action: The end time for the first loop is set to the current time. The data from the first loop is directed to an unused state machine instance, and the current state machine is set as the previous machine of the first loop. The data for both loops is added to the signature for this event. A check is made for evidence of tailgating.

EventCompletes: Registers the end of a normal (not a double detect)event.

Activated when: Both loops are no longer detecting, the data is of a type that indicates this is not a spurious event, and this lane is not involved in a double detection configuration, i.e. from the states:

InDetect2 when the second loop drops out of detect;

AfterTransferState when the part of the signature remaining after transfer of the next vehicle's component meets the above criteria; and ResolveRejection when the current event is left with no double detection partners, i.e. has become a normal event.

Associated action: The end time for the second loop is set to the current time. The data from the second detection loop is added to the signature.

The speed and length of the vehicle are determined. The times the loops were occupied are determined. The direction of the event is established (forward or reverse). Details of the event and its signature are output as required by the particular application. Data from the second loop is re-directed to the state machine previously selected for the first loop (this happened in the EventCont2 transition).

Correlating: Add new data for both loops, with both detecting.

Activated when: Both loops are detecting, and new data arrives that doesn't change that condition.

Associated action: Add the new data for each loop to the signature for each loop.

Premature2End: Handles the case where the second loop has unexpectedly dropped out of detect before the first.

Activated when: The second loop drops out of detect before the first in the state InDetectBoth.

Associated action: The end time for the second loop is set to the current time. The data for both loops is added to their signatures. A check is made for evidence of tailgating.

ShortEvent1: Registers that the first loop has dropped out of detect before the second has started detecting.

Activated when: The first loop drops out of detect before the second is detecting in the state InDetect1.

Associated action: The same as for EventCont2.

SpuriousEvent: Handles the case of the data associated with an event being considered spurious, for example low level spillover from the adjacent lane.

Activated when: The event is completed, (either by tailgating being detected, both loops going out of detect, or from the ClearPending1 state, the timeout being exceeded or a forced end being received), and The data is evaluated as spurious. The data is considered spurious if:

Either of the loops maxima is below the spurious level (e.g. an amplitude of 20 for Peek MTS38Z MkII), the time for the event is too short (e.g. 70 milliseconds for a standard 2-2-2meter loop configuration), or the event is not part of a double detection configuration, and the length of the event is too long (normally greater than 5 seconds), and amplitude of the signature maxima differ by more than 50%.

Associated action: The data is discarded. If the event is part of a double detection configuration, it is removed from the configuration (if the configuration is ready for completion after this action, it is completed). If the state machine is in ClearPending1 state and the Event state machine currently receiving data from the second loop is in the InDetect2 state, then increment its count of "other loop detections" (when this reaches a threshold, the loop will be considered in a "stuck on" fault state), else set the state machine receiving input from the second loop to be that receiving input from the first. Evidence of tailgating is checked for.

PossibleCycle: Registers that the second loop has entered detect subsequent to the first loop dropping out, and before the timeout has occurred indicating a short vehicle is traversing the loops.

Activated when: The state machine is in ClearPending1 and the second loop goes into detect.

Associated action: The same as EventCont1.

ShortEventCompletes:Same as EventCompletes.

DoubleBoth: Both entry and exit loops have registered a valid double detect (a straddling vehicle).

Activated when: A double detection configuration is ready for completion, i.e. all individual events within the configuration are completed.

Associated action: The first step is to decide how many vehicles are in the double detection configuration. If there are two lanes involved in the 10 configuration, a check is made to see if the signatures still look like a straddling vehicle now that the events are completed. If they do, there is one vehicle, else there are two. If three lane are involved we assume there are at least two vehicles in the configuration, and a test is made to see if we have three by checking the signatures. If there are 4 or more lanes in the configuration, the number of adjacent lane pairs not showing as having straddling vehicles is determined. If all show as having straddling vehicles with a similar amplitude, this is assessed as the configuration having a vehicle straddling every second lane. Where a lane pair has a geometric mean a factor of two or more higher than the others, this is interpreted as being two vehicles straddling in adjacent lanes. Where a mean is considerably higher, this is interpreted as this being from a vehicle in-lane in lane n, where n is the lane with the higher signature maximum, and there being a vehicle straddling lanes n−1 and n−2, or n+1 and n+2, depending on the positioning of the high signature in the double configuration.

Having decided on the vehicle locations, each lane pair having a straddling vehicle is examined, and a decision is made as to which of the two to use as the primary signature (the signature that will be used for assessing vehicle length and speed). Call these lanes n and n+1. If there is a vehicle also straddling lane n−1 and lane n and no vehicle straddling lanes n+1 and n+2, then if the lesser of the two maxima of the signature of lane n+1 is above a threshold (e.g. an amplitude of greater than 45), then it is selected as the primary. The converse is true if there is a vehicle straddling lanes n+1 and n+2 and no vehicle straddling lanes n−1 and n. Otherwise the signature having the higher absolute maximum value is used as the primary. The lane pair is now processed as a double detection, which is as for a normal completed event using the primary signature, unless specific properties of double detections are to be output.

Each lane assessed as having a vehicle in-lane (not straddling) is separated for the remainder of the configuration and treated as a normal completed event.

If the data from the two loops in the lane that completed last in the configuration are being directed to different state machines, the state machine receiving input from the first loop is assigned the data from the second loop.

DoubeBothpending: Handles the case where an event involved in a double configuration completes, but the configuration is not yet ready for completion (other events involved are not completed).

Activated when: An event in a double configuration completes, but the configuration is not yet complete (there is one or more other events in the configuration that are not completed).

Associated action: The end time for the second loop is set to the current time. The data from the loop is appended to the signature for the second loop, and the speed of the vehicle is obtained if the data is above the spurious level. A check for tailgating is carried out.

DoubleBothCompletes: Handles the case where a state machine has been in the WaitOtherLane state because it is part of a double detection configuration, and the configuration has now completed.

Activated when: A state machine is in the WaitOtherLane state and the double detection configuration has completed.

Associated action: Return the state machine to the pool for re-use.

Error1Ends: The second loop has unexpectedly dropped out before the first, and now the first has also dropped out.

Activated when: The state machine is in the Err1Active2Gone state and the first loop drops out of detect.

Associated action: As for SpuriousEvent.

IntoFaultState: The detectors have been operating normally, and have now gone into fault state.

Activated when: The detectors indicate a fault in any normal processing mode, or both loops indicate a fault in single loop mode, or one of the loops appears to be stuck on in inDetect2 and Err1Active2Gone states. The stuck on state is determined by there being multiple other loop detections in either of these states.

Associated action: A timeout is set to prevent rapid toggling into and out of the fault state. If the data from one of the loops is being directed to another state machine instance, the data is re-directed to this state machine and the other state machine is reset, after separating it from any double detection configuration it is involved in. If this lane is involved in a double detection configuration, then it is separated from the configuration. Any fault reporting required by the application is carried out. The tailgate state machine for this lane is reset.

Separating a lane from a double detection configuration involves breaking the links with the adjacent lanes, then completing the remainder of the configuration if it is ready for completion in consequence.

RenewTimeout: Handles the case where The state machine is in the fault state, and both loops are still faulty.

Activated when: The state machine is in the LoopFaulty state and the fault condition is still present. That is, both loops are still showing as faulty, or the stuck-on loop is still stuck on.

Associated action: The anti-toggling timeout is re-established.

Turnoff: A command has been received to turn off the lane.

Activated when: The turn off command is received.

Associated action: The state machine is reset.

TurnOn: A command has been received to turn on the lane, and it was previously turned off.

Activated when: The state machine is in the LaneOff state and a command is received to turn it on.

Associated action: None

OutOfFaultState: Handles the case where a fault has cleared.

Activated when: The fault condition has completely cleared and neither loop is detecting.

Associated action: Logs the end of fault condition if required.

SpuriousShort: Handles the case of spurious data appearing in the first loop while the second loop is still activated with an event.

Activated when: The state machine is in InDetect1 and the first loop goes out of detect, and the second loop is still handling a different event, and the amplitude of the first loop data is less than a threshold (e.g. 40), and a check for tailgating on the second loop shows that it is not tailgating.

Associated action: The event is separated from any double detection configuration it is involved in, and the state machine is reset.

Tailgate: Handles the case of a vehicle being tailgated by another when neither are involved in a double detection configuration.

Activated when: A check for tailgating indicates that tailgating is occurring, and the event is not involved in a double detection configuration, and the state machine is in one of the states: InDetectBoth, InDetect2, or Err1Active2Gone.

Associated action: The same as EventCompletes (the signatures have already been separated by the Tailgate state machine).

DoubleTailgate: Handles the case of a vehicle being tailgated by another when it is involved in a double detection configuration.

Activated when: A check for tailgating indicates that tailgating is occurring, and the event is involved in a double detection configuration, the configuration is ready for completion, and the state machine is in one of the states: InDetectBoth, InDetect2, or Err1Active2Gone.

Associated action: The same as DoubleBothCompletes.

DoubleTailgatePending:Handles the case of a vehicle being tailgated by another when it is involved in a double detection configuration.

Activated when: A check for tailgating indicates that tailgating is occurring, and the event is involved in a double detection configuration, the configuration is not ready for completion, and the state machine is in one of the states: InDetectBoth, InDetect2, or Err1Active2Gone.

Associated action: The same as DoubleBothPending.

RejectPendingDouble:Handles the case of an event that was initially thought to be part of a double detection configuration, and is now known not to be.

Activated when: In the states AfterTransferState, InDetect2 or InDetect2Pending1, a completing event that is part of a double detection configuration is now found not to be.

Associated action: The event is separated from the double configuration on the side(s) where the configuration is found to be no longer valid.

ActuallyTwoVehicles: Handles the case of a pending event that is part of a double configuration where the partner just completing has established that it is not part of the configuration.

Activated when: A state machine is in the WaitOtherLane state and it is called with an indication that has been separated from a double detection configuration.

Associated action: If the event is still part of a double (with the lane on the other side), then the configuration is completed as a double, else this is completed as a separate event.

SpuriousReverseDetected: Handles the case where a reverse event is found to be the result of adjacent lane spillover merging with the start of a real event in this lane.

Activated when: The event direction is reverse, the first loop data maximum is less than a threshold (e.g. 40), and the second loop data amplitude exceeds a given multiplier of the first loop amplitude (e.g. 4 times).

Associated action: The data from the current first loop is discarded. The data from both loops is directed to this state machine. The data direction is set to normal, so the current first loop becomes the new second loop, and the current second loop becomes the new first loop. The data received is accumulated.

WaitingForRealSignature: Handles the case subsequent to a spurious reverse being detected while waiting for the second loop data to indicate that data from a real signature is now arriving.

Activated when: The state machine is in the WaitRealData state and the second loop is still detecting, and the data amplitude is still below a threshold (e.g. 40).

Associated action: Append the data for the first loop to the first loop signature.

GotRealDataStart: Handles the case subsequent to a spurious reverse being detected when the second loop data indicates that real data is now arriving.

Activated when: In the WaitRealData state the first loop is still detecting, and the second loop data is greater than a threshold (e.g. 40).

Associated action: The same as for EventCont1.

LeadingMergeEnds: Handles the case subsequent to a spurious reverse being detected when the second loop drops out of detection.

Activated when: The second loop drops out of detect in the state WaitRealData.

Associated action: Append the data for the firs: loop to the first loop signature.

TransferDataToNext: Handles the case where an apparently normal event has proceeded to the InDetect2 state, and it appears that there is a following second loop signature merged with this signature.

Activated when: The state machine is in the InDetect2 state, and the direction is forwards, and the second loop signature rises to greater than a given multiplier of the first loop signature (e.g. 4).

Associated action: The data from the second loop is appended to the second loop signature. The point in the second loop signature where the new signature data started is located. The data after this point for the second loop is transferred to the state machine receiving data from the first loop. The state of that state machine is set to InDetectBoth. The second loop detector data is directed to that state machine.

TransferDataAtDrop: Handles the case where spill-over data from an adjacent lane giving an apparent reverse event has merged with the start of a real forward direction event on the entry loop only.

Activated when: The state machine is in the InDetect2 state, the event direction is reverse, the second loop has dropped out of detect, the first loop signature peak is less than a threshold (e.g. 40), The second loop signature peak is greater than a given multiple of the the first loop peak (e.g. 4 times), and the event is not part of a double detection configuration.

Associated action: The second loop detector data is appended to the second loop signature. The second loop (i.e. the entry loop, since the current even is a reverse event) data is transferred to the entry loop of the state machine currently handling the exit loop. If the event being handled by this state machine is involved in a double configuration, and there there is no double configuration being handled by the state machine handling the exit loop data, then the the double configuration is passed to the exit loop state machine. The state of the exit loop state machine is set to InDetect2. The direction of the exit loop state machine is set to normal. The state machine handling the entry loop is reset and left handling the entry loop.

FaultToSingle: Handles the case where only one loop is in the faulty state and the other is operating satisfactorily, so it can be used for single loop operation.

Activated when: The state machine is in the LoopFaulty state, and one loop is not faulty.

Associated action: The fault state is reported if required by the particular application.

SingleToClear: Handles the case where one loop which was faulty starts operating correctly gain.

Activated when: The state machine is in the SingleLoopClear state and both loops start operating Correctly.

Associated Action: None.

SingleToFault: Handles the case where the system is operating in single loop mode, and both loops go faulty.

Activated when: Both loops become faulty in any of the single loop states.

Associated action: The same as TntoFaultState.

SingleDetect: Handles the case where the single operating loop goes into detect.

Activated when: The state machine is in SingleLoopClear and the operating loop goes into detect.

Associated action: The event start time is set to the current time, and the loop data starts the event signature.

StillSingleDetect: A single loop detect is still active.

Activated when: The lane is operating in single loop mode, and the loop is still detecting, and the speed estimate status has not changed.

Associated action: The new data element is added to the signature.

SingleDetectEnds: A detect that is not part of a double detection configuration has ended in single loop mode.

Activated when: The loop goes out of detect, and the event is not part of a double detection configuration.

Associated action: The new data item is added to the signature. The mean speed is determined from the single loop estimates made. Outputs are made as required by the application. The state machine is reset ready for re-use.

SingleDetectEndsDouble: A single loop mode detect that is part of a double detection configuration ends, and the configuration is ready for completion.

Activated when: The loop goes out of detect, and the event is part of a double detection configuration, and the configuration is now ready for completion.

Associated action: The new data item is added to the signature. The mean speed is determined from the single loop estimates made if the data amplitude is above a threshold (e.g. 20). The event is completed as for DoubleBothCompletes, taking care to include only the data from the operating loop in this lane.

SingleDetectEndsPending: A single loop mode detect that is part of a double detection configuration ends, and the configuration is not ready for completion.

Activated when: The loop goes out of detect, and the event is part of a double detection configuration, and the configuration is not ready for completion.

Associated action: The new data item is added to the signature. The mean speed is determined from the single loop estimates made if the data amplitude is above a threshold (e.g. 20). A new state machine is selected to receive data for this lane.

SpeedEstimateGood: in single detect mode, an assessment of the speed estimates has been made, and they indicate a good measurement has been made.

Activated when: There are two or more speed estimates made, and the mean of the estimates made is less than or equal to the maximum likely speed (e.g.60 meters/second, but depends on application) and greater than or equal to the minimum speed for good single loop operation (e.g. 2.5 meters/second, but depends on application).

Associated action: The same as StillSingleDetect.

SpeedEstimateBad: In single detect mode, an assessment of the speed estimates has been made, and they indicate a bad measurement has been made.

Activated when: There are two or speed estimates made, and the mean of the estimates made is greater than to the maximum likely speed (e.g. 60 meters/second, but depends on application) or less than to the minimum speed for good single loop operation (e.g. 2.5 meters/second, but depends on application), and the application requires good speed estimates.

Associated action: None.

SpuriousSingleEnds: Handles the case in single loop mode where the mean of the speed estimates is bad and the event ends.

Activated when: The state machine is in the SingleSpurious state and the loop goes out of detect, and the event is not part of a double detection configuration.

Associated action: The state machine is reset for re-use.

SpuriousSingleEndsDouble: Handles the case in single loop mode where the mean of the speed estimates is bad and the event ends, and the event is part of a double detection configuration.

Activated when: The state machine is in the SingleSpurious state and the loop goes out of detect, and the event is part of a double detection configuration.

Associated action: The event is separated from the remainder of the double detection configuration (on both side, if needed), and if the remainder of the configuration is now ready for completion, it is completed.

SinglePendingEnds: Handles the case of a single loop detection that was waiting for completion of a double detection configuration, and the configuration has now completed.

Activated when: The state machine is in the WaitotherSingle state, and the configuration completes, and the event is still part of the configuration.

Associated action: The state machine is reset ready for re-use.

SingleActuallyTwo: Handles the case of a single loop detection that was waiting for completion of a double detection configuration, and the configuration has now completed, but this event has been found to be separate from the remainder of the configuration.

Activated when: The state machine is in the WaitotherSingle state, and the configuration completes, and the event has been separated from part of the configuration.

Associated action: If the event is not part of any remaining double detection configuration, the action is the same as DetectEnds, else the action is the same as DetectEndsDouble.

2.2. The Tailgate State Machine 2.2.1. Description of States

Figure 14:
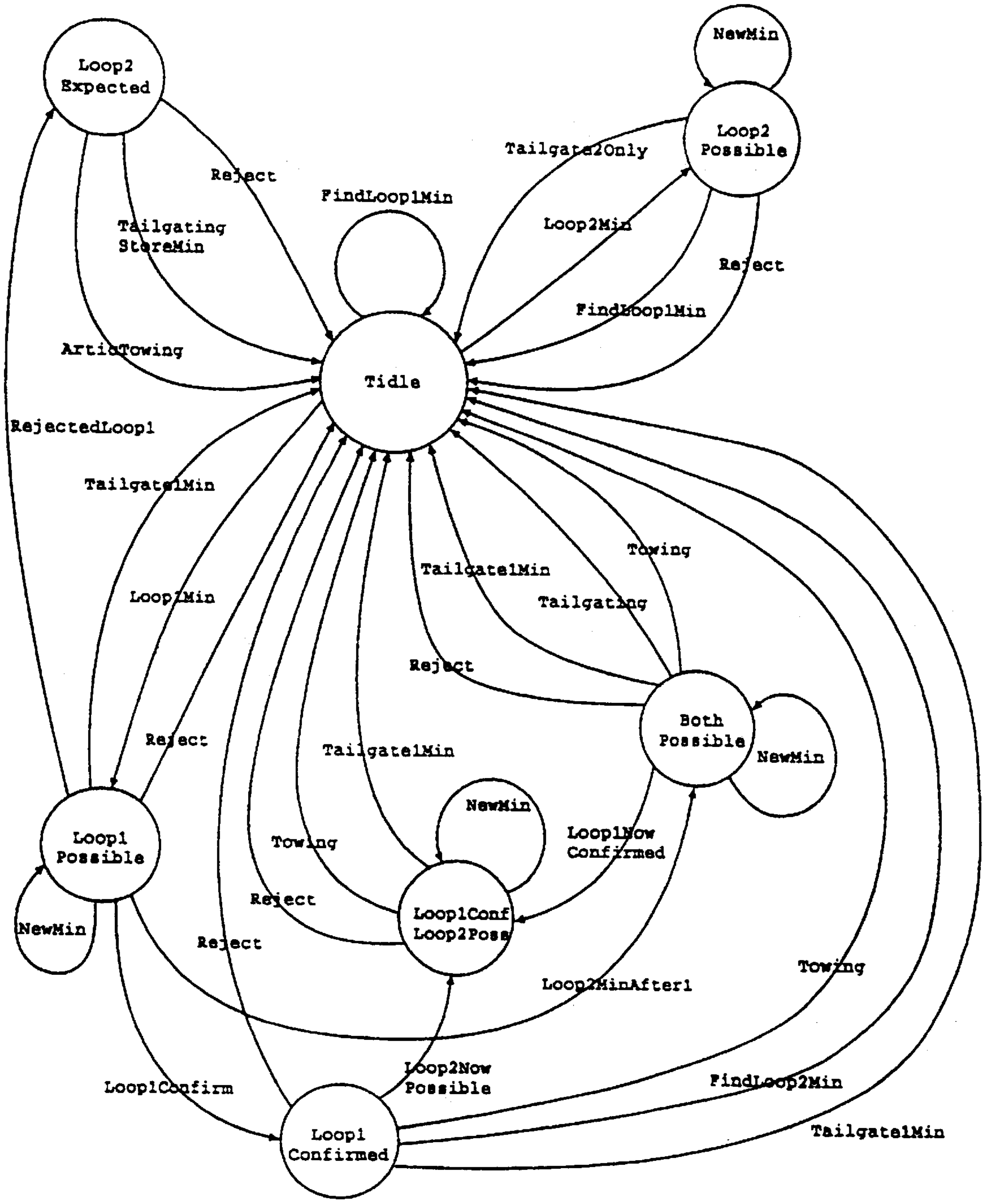
FIG. 14 is the transition diagram of the Tailgate State Machine of the structure illustrated in FIG. 12.

FIG. 14 forms the transition diagram for the Tailgate State Machine.

Tidle:

The Tailgate state machine is idle, nothing has indicated that tailgating may happen.

Loop1Possible:

A minimum in the first loop signature is below the threshold for tailgate detection for the speed of the vehicle. This indicates that the vehicle is either towing something, or that there are two vehicles tailgating.

Loop1Confirmed:

After there being a candidate minimum, the signal has subsequently risen to a level that indicates that the minimum signifies a tailgating or towing situation, i.e. that the minimum was not a glitch in the tail end of the signature.

BothPossible:

Candidate minima, indicating a tailgating or towing situation, have been seen in both first and second loop signatures.

Loop2Possible:

A candidate minimum has been seen in the signature from the second loop only. This can happen if two vehicles were further apart over the first loop, and so the first loop signatures separated properly, but came closer over the second loop.

Loop2Expected:

A minimum that was rejected as a tailgating indicator occurred over the first loop, so expect the same over the second and reduce sensitivity a little to prevent false triggering.

Loop1ConfLoop2Poss:

A candidate minimum confirmed by a following maximum has been seen in the first loop signature, and a candidate minimum only has been seen in the second loop signature.

2.2.2. Description of Transitions

TnoAction: Do nothing.

Activated when: An input occurs that does not require storage and does not change the state of the state machine.

Associated action: None.

Loop1Min: A minimum has occurred in the first loop signature that possibly indicating tailgating.

Activated when: The Tailgate state machine is in the Tidle state an a minimum occurs in the first loop signature that meets the tailgating criteria for the estimated speed of the vehicle.

Associated action: Details of the minimum are stored (amplitude, time, and which minimum it is).

Loop2MinAfter1: A minimum occurs in the second loop signature that indicates tailgating may indeed be occurring.

Activated when: A minimum occurs in the second loop signature that meets the tailgating amplitude criterion for the speed, and the minimum is not the same proportional amplitude as the matching first loop minimum, or the level of the second loop minimum is so low as to certainly indicate tailgating (e.g. less than 35).

Associated action: Details of the minimum are stored (amplitude, time, and which minimum it is).

Loop1Confirm: A first loop minimum is followed by a confirming maximum.

Activated when: The state machine is in the Loop1Possible state and the current first loop signature data is greater than the confirmation level (A default value of 300).

Associated action: None.

Reject: Tailgating is rejected as the reason for the observed signature.

Activated when: The state machine is in the Loop1Confirmed state and both loops drop out of detection, or the state machine is in the BothPossible state and either loop drops out of detection, or the state machine is in the Loop2Possible state and the second loop drops out of detection or the first loop drops out of detection and the second loop current data amplitude is less than a certain threshold (e.g. 40), or the state machine is in the Loop2Expected state and the first loop drops out of detection.

Associated action: The state machine is reset.

NewMin: A new minimum occurs that doesn't change the state of the state machine.

Activated when: (The state machine is in the state Loop1Possible and a new minimum occurs in the first loop data, or the state machine is in the BothPossible state and a new minimum occurs in either loop, or the state machine is in the states Loop1ConfLoop2Poss or Loop2Possible and a new minimum occurs in the second loop) and the minimum is less than the currently stored value.

Associated action: Details of the minimum are stored (amplitude, time, and which minimum it is).

Tailgate1Min: Tailgating is confirmed based on a first loop minimum only.

Activated when The state machine is in the Loop1Possible state and either the first loop drops out of detection and the lowest minimum is less than a given threshold (e.g. 25) and the current data level is greater than the confirmation level (e.g. 300) or the second loop drops out. Alternatively, the state machine is in the Loop1confirmed state and the second loop has dropped out of detection and the first loop hasn't.

Associated action: The signature for the first loop is split at the time of the candidate minimum, and the data after this is transferred to a free Event state machine. Data from both loops is now directed to the selected Event state machine.

The Event state machine handling the data so far has a tailgating indication set so that it will complete processing this event. The Tailgate state machine is reset ready for re-use.

Towing: The data from both loops indicates that the event signifies a towing vehicle.

Activated when: The state machine is in the states Loop1Confirmed, or Loop1ConfLoop2Poss and a second loop minimum occurs that is equal to the first loop minimum.

Associated action: If required by the application, the Event state machine has an indication set that the event represents a towing vehicle. The Tailgate state machine is reset ready for re-use.

Tailgating: Tailgating is confirmed.

Activated when: The state machine is in the Loop1ConfLoop2Poss state and the second loop data is greater than the confirmation level (e.g. 300) and there is a second loop minimum meeting the possible tailgating criteria and this minimum is not the same amplitude as the first loop minimum. Alternatively in the same state the first loop drops out and the second is still detecting and its current data amplitude is greater than the confirmation level. Alternatively the state machine is in the Loop2Expected state and the second loop drops out.

Associated action: The signature for both loops is transferred to a free Event state machine, or only the data for the first loop if there is no candidate minimum in the second loop signature. Data from both loops is directed to the newly selected Event state machine. The Event state machine handling the current event has an indication set that tailgating has been detected, so that it will complete immediately. The Tailgate state machine is reset ready for re-use.

Loop2Min: A low minimum has occurred in the loop 2 data, tailgating is possible.

Activated when: The state machine is in the Tidle state and a minimum occurs that is a small percent less than the normal criterion for the estimated speed (e.g. 4% less), or in the same state data from the first loop is directed to another Evenet state machine and a minimum has occurred in the second loop that is less than 12.5% of the overall maximum in the signature, or that is less than a given threshold (e.g. 40).

Associated action: Details of the minimum are stored.

FindLoop1Min: There is an indication from the second loop signature only that tailgating is occurring.

Activated when: The state machine is in the Tidle state and the first loop is detecting and the second isn't (and has been) and the overall maximum in the second loop data is less than a given threshold (e.g. 20). Alternatively the state machine is in the Loop2Possible state and the current second loop data amplitude is greater than the confirmation level and the first loop is still detecting, or the reason for this activation of the Tailgate state machine is that the first loop has just dropped out.

Associated action: The lowest minimum between maxima that are greater than a given theshold (e.g. 40) is located. If such can be found and the amplitude is less than a given percentage of the overall maximum of the signature (e.g. 35%), then the signature is split at this point. If a minimum meeting the above criteria cannot be found, then if and only if the overall current data amplitude of the first loop data is less than a given threshold (e.g. 40), then the first loop data is split at the point where it starts to trend upwards significantly (dealing with the case of leading merged shadow data). The second loop data is split at the point of the lowest confirmed candidate minimum if there is one, else it is not split. Data from both loops is directed to the newly selected Event state machine. The Even state machine handling the current event has an indication set that tailgating has been detected, so that it will complete immediately. The Tailgate state machine is reset ready for re-use.

Tailgate2Only: A second loop minimum is confirmed as indicating tailgating, there is no confirmed first loop minimum, and the first loop is not detecting.

Activated when: The state machine is in the Loop2Possible state and the candidate minimum is confirmed by the second loop data exceeding the confirmation level, and the first loop is not currently detecting.

Associated action: If the Event state machine that was receiving first loop data (and is now the designated "previous" one for that loop) is in the ClearPending1 state, then it becomes the target state machine, else the target state machine is the one currently receiving first loop data. The second loop signature is split and all after the split is transferred to the target state machine. Data from the second loop is directed to the target state machine. An indication that tailgating has been detected is set in the current Event state machine so that it will complete immediately. The current tailgate state machine is reset for re-use.

RejectedLoop1: A candidate minimum has been rejected in the first loop signature.

Activated when: A candidate minimum in the second loop signature has occurred and is found to be the same as the candidate first loop signature. Alternatively there is a candidate minimum in the first loop signature and its amplitude is greater than a given threshold (e.g. 25) or if it is less than the threshold, when the first loop drops out of detection its signature maximum is not greater than the confirmation level.

Associated action: None.

ArticTowing: There is a minimum expected in the second loop data and when it occurs it is the same as the candidate (unconfirmed) first loop minimum, using a wide comparison window.

Activated when: The state machine is in the Loop2Expected state and a minimum occurs in the second loop data which meets the tailgating amplitude criterion for the estimated speed of the vehicle, and the minimum is the same as the first loop minimum within the constraints of a wide comparison window.

Associated action: The same as for Towing.

TailgatingStoreMin: There is a minimum expected in the second loop data and when it occurs it is not the same as the candidate (unconfirmed) first loop minimum, using a wide comparison window.

Activated when: The state machine is in the Loop2Expected state and a minimum occurs in the second loop data which meets the tailgating amplitude criterion for the estimated speed of the vehicle, and the minimum is the same as the first loop minimum within the constraints of a wide comparison window.

Associated action: The minimum is stored, and then the action is the same as for Tailgating.

Loop1NowConfirmed: Both loops have candidate minima, and the first loop data has exceeded the confirmation level.

Activated when: The state machine is in the BothPossible state and the first loop data exceeds the confirmation level.

Associated action: The same as for Loop1Confirm.

Loop2NowPossible: There is a confirmed first loop minimum and a candidate minimum that is not the same in the second loop signature.

Activated when: The state machine is in the Loop1Confirmed state and a candidate minimum occurs in the second loop signature that is not the same as the first loop confirmed candidate.

Associated action: The same as for Loop2MinAfter1.

What is claimed is:

1. Signal processing apparatus for processing sensor signals from a road vehicle sensing apparatus of the type defined for a multi lane highway, comprising means arranged to monitor the timing of sensor signals generated from sensors in adjacent lanes of a highway and to provide an indication when such sensor signals could correspond to a double count with a single vehicle being detected by both sensors, and means arranged to respond to said indication from said monitoring means to calculate the geometric mean of the amplitudes of the sensor signals from the sensors in adjacent lanes, and to provide a double count indication if said geometric mean is below a predetermined threshold value.

2. Signal processing apparatus as claimed in claim 1, wherein said means arranged to respond is further arranged to provide a probable double count indication if said geometric mean is above said predetermined threshold value but below a higher predetermined threshold value, and the apparatus further comprises additional testing means responsive to said probable double count indication to test for a double count.

3. Signal processing apparatus as claimed in claim 2, wherein said additional testing means is arranged to confirm a double count if the envelope of the sensor signal from the sensor in one of the adjacent lanes is contained entirely within the envelope of the signal from the sensor in the other of the adjacent lanes after allowing for any timing difference corresponding to the adjacent sensors not being aligned across the width of the highway.

4. Signal processing apparatus for processing sensor signals from a road vehicle sensing apparatus of the type defined, comprising timing means arranged to determine the time between predefined points on the leading and trailing edges of a sensor signal produced by a vehicle travelling past the sensor, and calculating means arranged to calculate a value for the length of said vehicle from the product of said time and a value for the speed of the vehicle, wherein said timing means comprises:

a) means to determine in the profile of the leading edge of said sensor signal a first high signal magnitude value at a first minimum in the modulus of the gradient of the leading edge profile nearest to the start of said leading edge, b) means to find a timing start point on said leading edge before said first minimum at which the sensor signal has a start magnitude value which is a first predetermined fraction of said first high signal magnitude value, c) means to determine in the profile of the trailing edge of the sensor signal a last high signal magnitude value at a last minimum in the modulus of the gradient of the trailing edge profile nearest to the finish of the trailing edge, d) means to find a timing end point on said trailing edge after said last minimum at which the sensor signal has an end magnitude value which is a second predetermined fraction of said last high signal magnitude value; and e) means to utilize said timing start point and said timing end point as said predefined points for determining said time.

5. Signal processing apparatus as claimed in claim 4, wherein said timing means is arranged to disregard as said nearest minimum any minimum in the modulus of the gradient at which the gradient is more than 25% of the maximum gradient in the respective edge.

6. Signal processing apparatus as claimed in claim 4, wherein said timing means is arranged to disregard as said nearest minimum any minimum in the modulus of the gradient at which the signal magnitude is less than 65% of the magnitude at the nearest maximum point on said respective edge where the gradient is zero.

7. Signal processing apparatus as claimed in claim 4, wherein said timing means is arranged to disregard as said nearest minimum any minimum in the modulus of the gradient at which the gradient is not less than 35% of the maximum gradient in the respective edge for at least 15% of the duration of the edge.

8. Signal processing apparatus as claimed in claim 4, wherein said timing means is arranged such that said predetermined fraction of said nearest adjacent high signal magnitude is in the range 25% to 75%.

9. Signal processing apparatus for processing sensor signals from a road vehicle sensing apparatus of the type defined, comprising recording means arranged to record magnitude values for a sensor signal taken at a plurality of intervals as a vehicle passes the sensor, means arranged to provide a value for the speed of the vehicle, said intervals being selected in association with said speed value to correspond to positions having predetermined spacings along the vehicle, calculating means arranged to calculate values for said recorded magnitudes which are normalized relative to the maximum amplitude of the sensor signal, storage means containing an empirically derived function relating said normalized recorded magnitude values to the length of a vehicle producing said sensor signal, and processing means arranged to derive a value for the length of the vehicle from said function and said normalized values.

10. Signal processing apparatus as claimed in claim 9, wherein said calculating means is arranged to determine whether the sensor signal has respective separate maxima adjacent the leading and trailing edges of the signal and then to set the recorded magnitude values taken at each of the intervals between said maxima at the magnitude value of one of the maxima.

11. Signal processing apparatus for processing sensor signals from a road vehicle sensing apparatus of the type defined with two successive sensors in a single lane, comprising means arranged to monitor the trailing edge of the signal from the entry sensor and the leading edge of the signal from the leaving sensor as a vehicle passes the sensors and to determine a value for the signal magnitude at the time when said magnitude values in said trailing and leading edges are substantially the same, and calculating means arranged to calculate a value for the length of the vehicle from said determined signal magnitude value.

12. Signal processing apparatus as claimed in claim 11, wherein said means arranged to monitor is further arranged to record magnitude values for said sensor signal from the entry sensor at least from the maximum of said signal over said trailing edge, to record magnitude values for said sensor signal from the leaving sensor at least over said leading edge to the maximum of said signal, to correlate the timing of the recorded values from the two sensors, to normalize said recorded values for each of the sensor signals relative to the recorded maximum of the respective sensor signal, and to determine the normalized value at the time when said normalized recorded values in the trailing and leading edges are substantially the same, and said calculating means calculates the length value from said determined normalized value.

13. Signal processing apparatus as claimed in claim 11, wherein said means arranged to monitor is arranged to determine the actual signal magnitude value when the values in said edges are the same, and said calculating means calculates said length value from said determined actual value and the maximum amplitude of at least one of the sensor signals.

14. Signal processing apparatus for processing sensor signals from a road vehicle sensing apparatus of the type defined with successive sensors in a single lane;

the processing apparatus being for use in determining values for the lengths of vehicles passing the sensors when the vehicles are long enough to extend fully over both sensors simultaneously whereby a first high point in the signal from the leaving sensor occurs before the last high point in the signal from the entry sensor, a high point being defined as a minimum in the modulus of the gradient of the signal;

the apparatus comprising recording means arranged to record magnitude values for the sensor signals from each of said entry and leaving sensors and to correlate the values from one sensor with the values from the other sensor recorded at the same time;

identifying means for identifying at least one point on a leading edge of the signal from the leaving sensor or on the trailing edge of the signal from the entry sensor, which point is empirically known to correspond respectively to a predetermined position of the front of the vehicle relative to the leaving sensor or the rear of the vehicle relative to the entry sensor;

time correlating means arranged to correlate said identified point on the respective above mentioned sensor signal (the first sensor signal) with a time correlated point on the other of said sensor signals (the second sensor signal);

profile correlating means arranged to correlate said time correlated point on said second sensor signal with a corresponding profile correlated point on the profile of said first sensor signal, representative of the vehicle having the equivalent positions in relation to the two sensors;

said time correlating means and said profile correlating means being further arranged to correlate said profile correlated point on said first sensor signal with a further time correlated point on said second sensor signal, to correlate said further time correlated point on said second sensor signal with a further corresponding profile correlated point on the profile of said first sensor signal, and alternately to repeat said time and profile correlations on said further points to provide correlated points over the full profile of the first sensor signal, and calculating means arranged to calculate a value for vehicle length from said empirically known predetermined position, the known spacing between the entry and leaving sensor, and the number of correlations by said profile correlating means.

15. Signal processing apparatus as claimed in claim 14, and including correction means arranged to normalize the magnitude value of the final point correlated by said profile correlating means on said first sensor signal relative to the nearest high point in the signal and to correct the calculated length value by an amount dependent on the difference between said normalized magnitude and an empirically determined reference magnitude.

16. Signal processing apparatus for processing sensor signals from a road vehicle sensing apparatus of the type defined with two successive sensors in a single lane, comprising recording means arranged (a) to record, when a vehicle passes the sensors, magnitude values for the sensor signal from the entry sensor at least over the trailing edge of the profile of the signal from the adjacent high point, defined as the last point on the trailing edge where there is a minimum in the modulus of the gradient of the signal, (b) to record magnitude values for the sensor signal from the leaving sensor at least over the leading edge of the signal to the adjacent high point, defined as the first point on the leading edge where there is a minimum in the modulus of the gradient of the signal, and (c) to correlate the timing of the recorded values from the two sensors;

normalizing means arranged to normalize the recorded magnitude values for each sensor signal relative to the magnitude of the adjacent high point of the respective signal, selecting means to select a plurality of points on either one of the trailing edge of the entry sensor signal or the leading edge of the leaving sensor signal (said one edge), said selected points having predetermined normalized signal magnitudes, correlating means arranged to correlate said selected points on said one edge with time correlated points on the other edge and to identify the normalized magnitude values of said time correlated points, and calculating means arranged to use an empirically derived function to calculate a value for the length of the vehicle from said identified normalized magnitude values.

17. Signal processing apparatus for processing sensor signals from a road vehicle sensing apparatus of the type defined with two successive sensors in a lane, comprising monitoring means arranged to monitor at least one characteristic of the profiles of signals from the entry and leaving sensors and comparing means arrange to compare said monitored characteristic of a signal profile from the entry sensor with the next following signal profile from the leaving sensor and to provide a tailgating indication if said monitored characteristics in the profiles are sufficiently different to indicate that the two profiles are not produced by a single vehicle.

18. Signal processing apparatus as claimed in claim 17, wherein said monitoring means is arranged to determine the presence of and measure the magnitude value at a signal minimum of each profile, whereby said magnitude value at the minimum constitutes said characteristic.

19. Signal processing apparatus as claimed in claim 18, wherein said comparing means is arranged to provide a tailgating indication, if a signal minimum is detected in the signal profile from the entry sensors, but the subsequent profile from the leaving sensor drops directly from its maximum substantially to zero magnitude before rising again.

20. Signal processing apparatus as claimed in claim 18, wherein said comparing means is arranged to calculate the normalized magnitudes at each signal minimum relative to the maximum amplitude of the respective signal, and to compare said normalized magnitudes at minima.

21. Signal processing apparatus as claimed in claim 20, wherein said monitoring means is arranged to determine the presence of a signal minimum only if the normalized magnitude drops below a first predetermined threshold and then rises again above a second predetermined threshold above said first threshold.

22. Signal processing apparatus as claimed in claim 21, wherein said comparing means is arranged to provide a tailgating indication if a signal minimum is detected only in the signal profile from the leaving sensor.

23. Signal processing apparatus as claimed in claim 22, wherein said comparing means is arranged to provide said tailgating indication only if said signal minimum detected only in the profile from the leaving sensor has a normalized magnitude below a third predetermined threshold less than said first threshold.

24. Signal processing apparatus as claimed in claim 21, and including speed means arranged to determine from a sensor signal a value for the speed of the vehicle passing the sensor, and said monitoring means is arranged to reduce said first threshold for higher speed values.

25. Signal processing apparatus as claimed in claim 24, wherein said speed means is arranged to measure the time elapsing between predetermined normalized magnitudes on the leading edge of a signal profile, and to calculate said speed value from said elapsed time and an empirically determined distance corresponding to said predetermined normalized magnitudes.

26. Signal processing apparatus for processing sensor signals from a road vehicle sensing apparatus of the type defined, comprising recording means arranged to record, when a vehicle passes the sensor, magnitude values for the sensor signal at least over the leading edge of the profile of the signal to the adjacent high point, defined as the first point on the leading edge where there is a minimum in the modulus of the gradient of the signal and to record the relative timing of the recorded magnitude values, normalizing means arranged to normalize the recorded magnitude values relative to the magnitude of said adjacent high point, timing means arranged to determine from said recorded relative timing the elapsed time between two predetermined normalized magnitude values amongst the normalized recorded values, and calculating means arranged to calculate a value for the speed of the vehicle from said elapsed time and an empirically determined distance corresponding to said predetermined normalized magnitude values.

27. Signal processing apparatus for processing sensor signals from a road vehicle sensing apparatus of the type defined with two successive sensors in a lane, the signal generation circuit of the sensing apparatus operating to provide discrete sensor signal magnitude values at regular timing intervals corresponding to a scanning rate of the circuit, the signal processing apparatus comprising timing means arranged to measure the elapsed time between corresponding points in the respective magnitude profiles of the two sensor signals as a vehicle passes the entry and leaving sensors, and calculating means arranged to calculate a value for the speed of the vehicle from said elapsed time and the known distance between the sensors, wherein the timing means is further arranged to interpolate between time points corresponding to said regular timing intervals.

28. Signal processing apparatus as claimed in claim 27, wherein said corresponding points in the respective magnitude profiles are points at a selected magnitude value on corresponding leading or trailing edges of the profiles from the two sensors and the timing means is arranged to determine the timing at at least one of said points by identifying the discrete sensor signal magnitude values on either side of said selected value and using the differences between said discrete values and the selected value to calculate a fractional part of said regular timing interval by linear interpolation.

29. Signal processing apparatus for processing sensor signals from a road vehicle sensing apparatus of the type defined, comprising timing means arranged to determine the time between preferred points on the leading and trailing edges of a sensor signal produced by a vehicle travelling past the sensor, and calculating means arranged to calculate a value for the length of said vehicle from the product of said time and a value for the speed of the vehicle wherein said timing means comprises:

a) means to find in the profile of the leading edge of said sensor signal a timing start point at which said leading edge profile has a maximum positive value of gradient, b) means to find in the profile of the trailing edge of said sensor signal a timing end point at which said trailing edge profile has a maximum negative value of gradient; and c) means to utilize said timing start point and said timing end point as said predefined points for determining said time.

30. A method of processing sensor signals from a road vehicle sensing apparatus of the type defined for a multi lane highway, comprising the steps of monitoring the timing of sensor signals generated from sensors in adjacent lanes of a highway, providing an indication when such sensor signals could correspond to a double count with a single vehicle being detected by both sensors, and responding to said indication by calculating the geometric mean of the amplitudes of the sensor signals from the sensors in adjacent lanes, and providing a double count indication if said geometric mean is below a predetermined threshold value.

31. A method as claimed in claim 30, wherein a probable double count indication is provided if said geometric mean is above said predetermined threshold value but below a higher predetermined threshold value, and the method comprises an additional testing step responsive to said probable double count indication to test for a double count.

32. A method as claimed in claim 31, wherein said additional testing step confirms a double count if the envelope of the sensor signal from the sensor in one of the adjacent lanes is contained entirely within the envelope of the signal from the sensor in the other of the adjacent lanes after allowing for any timing difference corresponding to the adjacent sensors not being aligned across the width of the highway.

33. A method of processing sensor signals from a road vehicle sensing apparatus of the type defined, comprising the steps of providing indications of the time between predefined points on the leading and trailing edges of a sensor signal produced by a vehicle travelling past the sensor, and calculating a value for the length of said vehicle from the product of said time and a value for the speed of the vehicle, wherein said predefined points are points on said respective edges at which the sensor signal has a magnitude which is a predetermined fraction of the nearest adjacent high signal magnitude, said nearest adjacent high signal magnitude being defined as the magnitude at the nearest minimum in the modulus of the gradient.

34. A method as claimed in claim 33, wherein any minimum in the modulus of the gradient at which the gradient is more than 25% of the maximum gradient in the respective edge is disregarded as said nearest minimum.

35. A method as claimed in claim 33, wherein any minimum in the modulus of the gradient at which the signal magnitude is less than 65% of the magnitude at the nearest maximum point on said respective edge where the gradient is zero is disregarded as said nearest minimum.

36. A method as claimed in claim 33, wherein any minimum in the modulus of the gradient at which the gradient is not less than 35% of the maximum gradient in the respective edge for at least 15% of the duration of the edge is disregarded as said nearest minimum.

37. A method as claimed in claim 33, wherein said predetermined fraction of said nearest adjacent high signal magnitude is in the range 25% to 75%.

38. A method of processing sensor signals from a road vehicle sensing apparatus of the type defined, comprising the steps of recording magnitude values for a sensor signal taken at a plurality of intervals as a vehicle passes the sensor, providing a value for the speed of the vehicle, said intervals being selected in association with said speed value to correspond to positions having predetermined spacings along the vehicle, calculating values for said recorded magnitudes which are normalized relative to the maximum amplitude of the sensor signal, storing an empirically derived function relating said normalized recorded magnitude values to the length of a vehicle producing said sensor signal, and deriving a value for the length of the vehicle from said function and said normalized values.

39. A method as claimed in claim 38, wherein said calculating step includes the step of determining whether the sensor signal has respective separate maxima adjacent the leading and trailing edges of the signal and then setting the recorded magnitude values taken at each of the intervals between said maxima at the magnitude value of one of the maxima.

40. A method of processing sensor signals from a road vehicle sensing apparatus of the type defined with two successive sensors in a single lane, comprising the steps of monitoring the trailing edge of the signal from the entry sensor and the leading edge of the signal from the leaving sensor as a vehicle passes the sensors, determining a value for the signal magnitude at the time when said magnitude values in said trailing and leading edges are substantially the same, and calculating a value for the length of the vehicle from said determined signal magnitude value.

41. A method as claimed in claim 40, wherein said monitoring and determining steps include recording magnitude values for said sensor signal from the entry sensor at least from the maximum of said signal over said trailing edge, recording magnitude values for said sensor signal from the leaving sensor at least over said leading edge to the maximum of said signal, correlating the timing of the recorded values from the two sensors, to normalizing said recorded values for each of the sensor signals relative to the recorded maximum of the respective sensor signal, and determining the normalized value at the time when said normalized recorded values in the trailing and leading edges are substantially the same, said length value being calculated from said determined normalized value.

42. A method as claimed in claim 40, wherein said monitoring and determining steps include determining the actual signal magnitude value when the values in said edges are the same, and calculating said length value from said determined actual value and the maximum amplitude of at least one of the sensor signals.

43. A method of processing sensor signals from a road vehicle sensing apparatus of the type defined with successive sensors in a single lane;

the processing being for determining values for the lengths of vehicles passing the sensors when the vehicles are long enough to extend fully over both sensors simultaneously whereby a first high point in the signal from the leaving sensor occurs before the last high point in the signal from the entry sensor, a high point being defined as a minimum in the modulus of the gradient of the signal;

the method comprising the steps of recording magnitude values for the sensor signals from each of said entry and leaving sensors and correlating the values from one sensor with the values from the other sensor recorded at the same time;

identifying at least one point on a leading edge of the signal from the leaving sensor or on the trailing edge of the signal from the entry sensor, which point is empirically known to correspond respectively to a predetermined position of the front of the vehicle relative to the leaving sensor or the rear of the vehicle relative to the entry sensor;

time correlating said identified point on the respective above mentioned sensor signal (the first sensor signal) with a time correlated point on the other of said sensor signals (the second sensor signal);

profile correlating said time correlated point on said second sensor signal with a corresponding profile correlated point on the profile of said first sensor signal, representative of the vehicle having the equivalent positions in relation to the two sensors;

further correlating said profile correlated point on said first sensor signal with a further time correlated point on said second sensor signal, and correlating said further time correlated point on said second sensor signal with a further corresponding profile correlated point on the profile of said first sensor signal, alternately repeating said time and profile correlations on said further points to provide correlated points over the full profile of the first sensor signal, and calculating a value for vehicle length from said empirically known predetermined position, the known spacing between the entry and leaving sensor, and the number of correlations by said profile correlating means.

44. A method as claimed in claim 43, including the step of normalizing the magnitude value of the final point correlated by said profile correlating means on said first sensor signal relative to the nearest high point in the signal and correcting the calculated length value by an amount dependent on the difference between said normalized magnitude and an empirically determined reference magnitude.

45. A method of processing sensor signals from a road vehicle sensing apparatus of the type defined with two successive sensors in a single lane, comprising the steps of recording, when a vehicle passes the sensors, magnitude values for the sensor signal from the entry sensor at least over the trailing edge of the profile of the signal from the adjacent high point, defined as the last point on the trailing edge where there is a minimum in the modulus of the gradient of the signal, recording magnitude values for the sensor signal from the leaving sensor at least over the leading edge of the signal to the adjacent high point, defined as the first point on the leading edge where there is a minimum in the modulus of the gradient of the signal, correlating the timing of the recorded values from the two sensors;

normalizing the recorded magnitude values for each sensor signal relative to the magnitude of the adjacent high point of the respective signal, selecting a plurality of points on either one of the trailing edge of the entry sensor signal or the leading edge of the leaving sensor signal (said one edge), said selected points having predetermined normalized signal magnitudes, correlating said selected points on said one edge with time correlated points on the other edge and identifying the normalized magnitude values of said time correlated points, and using an empirically derived function to calculate a value for the length of the vehicle from said identified normalized magnitude values.

46. A method of processing sensor signals from a road vehicle sensing apparatus of the type defined with two successive sensors in a lane, comprising the steps of monitoring at least one characteristic of the profiles of signals from the entry and leaving sensors, comparing said monitored characteristic of a signal profile from the entry sensor with the next following signal profile from the leaving sensor, and providing a tailgating indication if said monitored characteristics in the profiles are sufficiently different to indicate that the two profiles are not produced by a single vehicle.

47. A method as claimed in claim 46, wherein said monitoring step includes determining the presence of and measuring the magnitude value at a signal minimum of each profile, whereby said magnitude value at the minimum constitutes said characteristic.

48. A method as claimed in claim 47, wherein a tailgating indication is provided, if a signal minimum is detected in the signal profile from the entry sensors, but the subsequent profile from the leaving sensor drops directly from its maximum substantially to zero magnitude before rising again.

49. A method as claimed in claim 47, wherein said comparing step includes calculating the normalized magnitudes at each signal minimum relative to the maximum amplitude of the respective signal, and to compare said normalized magnitudes at minima.

50. A method as claimed in claim 49, wherein said monitoring step includes determining the presence of a signal minimum only if the normalized magnitude drops below a first predetermined threshold and then rises again above a second predetermined threshold above said first threshold.

51. A method as claimed in claim 50, wherein a tailgating indication is provided if a signal minimum is detected only in the signal profile from the leaving sensor.

52. A method as claimed in claim 51, wherein said tailgating indication is provided only if said signal minimum detected only in the profile from the leaving sensor has a normalized magnitude below a third predetermined threshold less than said first threshold.

53. A method as claimed in claim 50, including the step of determining from a sensor signal a value for the speed of the vehicle passing the sensor, and said first threshold is reduced for higher speed values.

54. A method as claimed in claim 53, wherein the speed is determined by measuring the time elapsing between predetermined normalized magnitudes on the leading edge of a signal profile, and calculating said speed value from said elapsed time and an empirically determined distance corresponding to said predetermined normalized magnitudes.

55. A method of processing sensor signals from a road vehicle sensing apparatus of the type defined, comprising the steps of recording, when a vehicle passes the sensor, magnitude values for the sensor signal at least over the leading edge of the profile of the signal to the adjacent high point, defined as the first point on the leading edge where there is a minimum in the modulus of the gradient of the signal and recording the relative timing of the recorded magnitude values, normalizing the recorded magnitude values relative to the magnitude of said adjacent high point, determining from said recorded relative timing the elapsed time between two predetermined normalized magnitude values amongst the normalized recorded values, and calculating a value for the speed of the vehicle from said elapsed time and an empirically determined distance corresponding to said predetermined normalized magnitude values.

56. A method of processing sensor signals from a road vehicle sensing apparatus of the type defined with two successive sensors in a lane, the signal generation circuit of the sensing apparatus operating to provide discrete sensor signal magnitude values at regular timing intervals corresponding to a scanning rate of the circuit, the method comprising the steps of measuring the elapsed time between corresponding points in the respective magnitude profiles of the two sensor signals as a vehicle passes the entry and leaving sensors, and calculating a value for the speed of the vehicle from said elapsed time and the known distance between the sensors, wherein the elapsed time measuring step includes interpolating between time points corresponding to said regular timing intervals.

57. A method as claimed in claim 56, wherein said corresponding points in the respective magnitude profiles are points at a selected magnitude value on corresponding leading or trailing edges of the profiles from the two sensors and the timing at at least one of said points is determined by identifying the discrete sensor signal magnitude values on either side of said selected value and using the differences between said discrete values and the selected value to calculate a fractional part of said regular timing interval by linear interpolation.

58. A method of processing sensor signals from a road vehicle sensing apparatus of the type defined, comprising the steps of determining the time between a start point of maximum positive gradient on the profile of the leading edge of a sensor signal produced by a vehicle travelling past the sensor and an end point of maximum negative gradient on the trailing edge profile thereof, and calculating a value for the length of said vehicle from the product of said time and a value for the speed of the vehicle.

* * * * *

UNITED STATES PATENT AND TRADEMARK OFFICE

CERTIFICATE OF CORRECTION

PATENT NO. : 6,345,228 B1
DATED : February 5, 2002
INVENTOR(S) : Richard Andrew Lees It is certified that error appears in the above-identified patent and that said Letters Patent is hereby corrected as shown below:

Title page,
Item [56], References Cited, OTHER PUBLICATIONS, the publication should read as follows:
-- "Von Verkehrsdurchsage bis Mautstation", by Von Dr. Eckhart Gleiβner, Funkschau, vol. 63, No. 7, March 1991, pp. 73-75, 78 (translation also attached). --

Signed and Sealed this

Twenty-second Day of October, 2002

*Attest:*

JAMES E. ROGAN

*Attesting Officer*

*Director of the United States Patent and Trademark Office*